United States Patent
Ippolito et al.

(10) Patent No.: US 10,866,146 B2
(45) Date of Patent: Dec. 15, 2020

(54) SENSOR CIRCUIT, CORRESPONDING SYSTEM AND METHOD

(71) Applicant: STMicroelectronics S.r.l., Agrate Brianza (IT)

(72) Inventors: Calogero Marco Ippolito, Aci Castello (IT); Michele Vaiana, San Giovanni la Punta (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 16/356,128

(22) Filed: Mar. 18, 2019

(65) Prior Publication Data
US 2019/0316973 A1  Oct. 17, 2019

(30) Foreign Application Priority Data
Apr. 13, 2018 (IT) .................. 102018000004496

(51) Int. Cl.
| | | |
|---|---|---|
| H03M 3/00 | (2006.01) | |
| G05F 3/26 | (2006.01) | |
| G01K 7/01 | (2006.01) | |

(52) U.S. Cl.
CPC ............. G01K 7/01 (2013.01); G05F 3/265 (2013.01); H03M 3/324 (2013.01); H03M 3/458 (2013.01)

(58) Field of Classification Search
CPC .. G01K 7/01; G01K 7/015; G05F 3/00; G05F 3/02; G05F 3/08; G05F 3/10; G05F 3/16; G05F 3/20; G05F 3/26; G05F 3/265; G05F 3/267; H03M 3/30; H03M 3/322; H03M 3/324; H03M 3/326; H03M 3/458; H03M 3/46
See application file for complete search history.

(56) References Cited

U.S. PATENT DOCUMENTS

| | | |
|---|---|---|
| 6,456,145 B1 | 9/2002 | Pertijs et al. |
| 7,598,722 B1 | 10/2009 | Falik |

(Continued)

FOREIGN PATENT DOCUMENTS

| | | |
|---|---|---|
| CN | 101762338 A | 6/2010 |
| CN | 104458036 A | 3/2015 |

(Continued)

Primary Examiner — Diana J. Cheng
(74) Attorney, Agent, or Firm — Slater Matsil, LLP

(57) ABSTRACT

A circuit includes a first current source configured to produce a first current in a first current line through a first diode-connected transistor having a voltage drop across the first diode-connected transistor, the first current being proportional to an absolute temperature via a first proportionality factor; a second current source configured to produce a second current in a second current line through a second diode-connected transistor having a voltage drop across the second diode-connected transistor, the second current being proportional to the absolute temperature via a second proportionality factor; a third current source configured to produce a third current in a third current line through a third diode-connected transistor having a voltage drop across the third diode-connected transistor; and a processing network including a sigma-delta analog-to-digital converter, the processing network being coupled to the, the second, and the third diode-connected transistors.

20 Claims, 8 Drawing Sheets

(56) References Cited

U.S. PATENT DOCUMENTS

| | | | |
|---|---|---|---|
| 9,261,415 B1 | 2/2016 | Zhang | |
| 2017/0328790 A1* | 11/2017 | Bach | G01K 7/01 |
| 2018/0217009 A1* | 8/2018 | Yousefzadeh | G01K 15/005 |
| 2019/0316973 A1 | 10/2019 | Ippolito et al. | |

FOREIGN PATENT DOCUMENTS

| | | |
|---|---|---|
| CN | 204831597 U | 12/2015 |
| CN | 105487587 A | 4/2016 |
| CN | 209784847 U | 12/2019 |
| EP | 2295944 A2 | 3/2011 |
| TW | I359945 B | 3/2012 |
| WO | 2013177425 A1 | 11/2013 |

\* cited by examiner

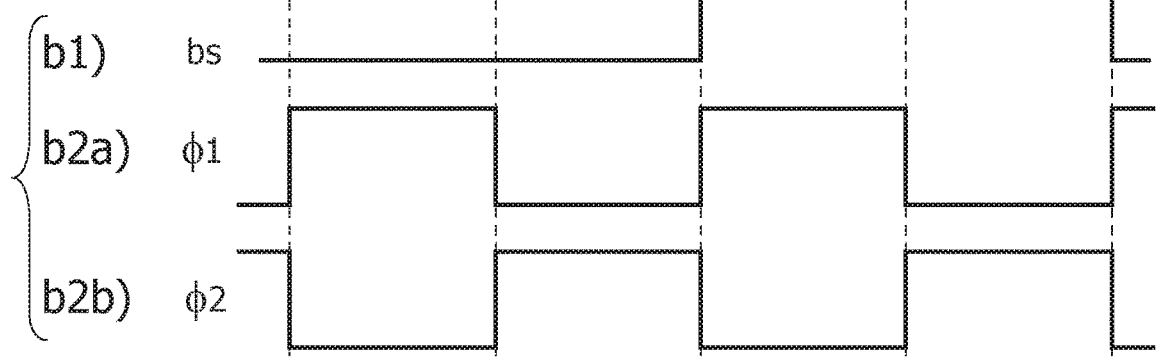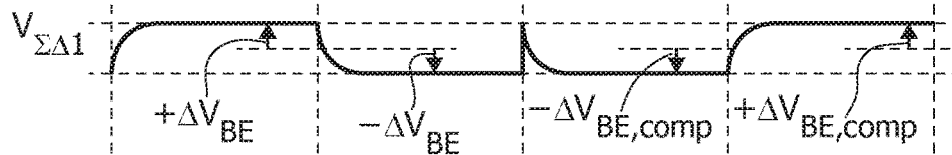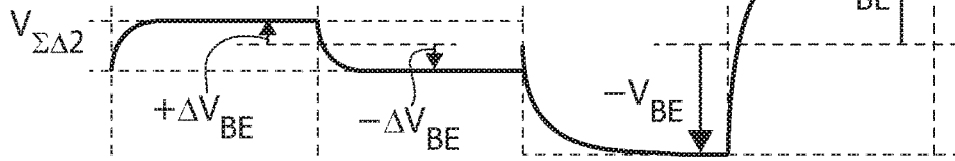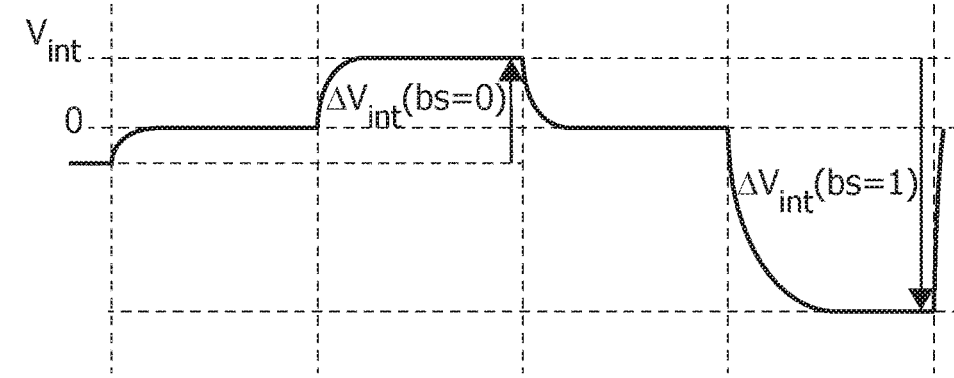

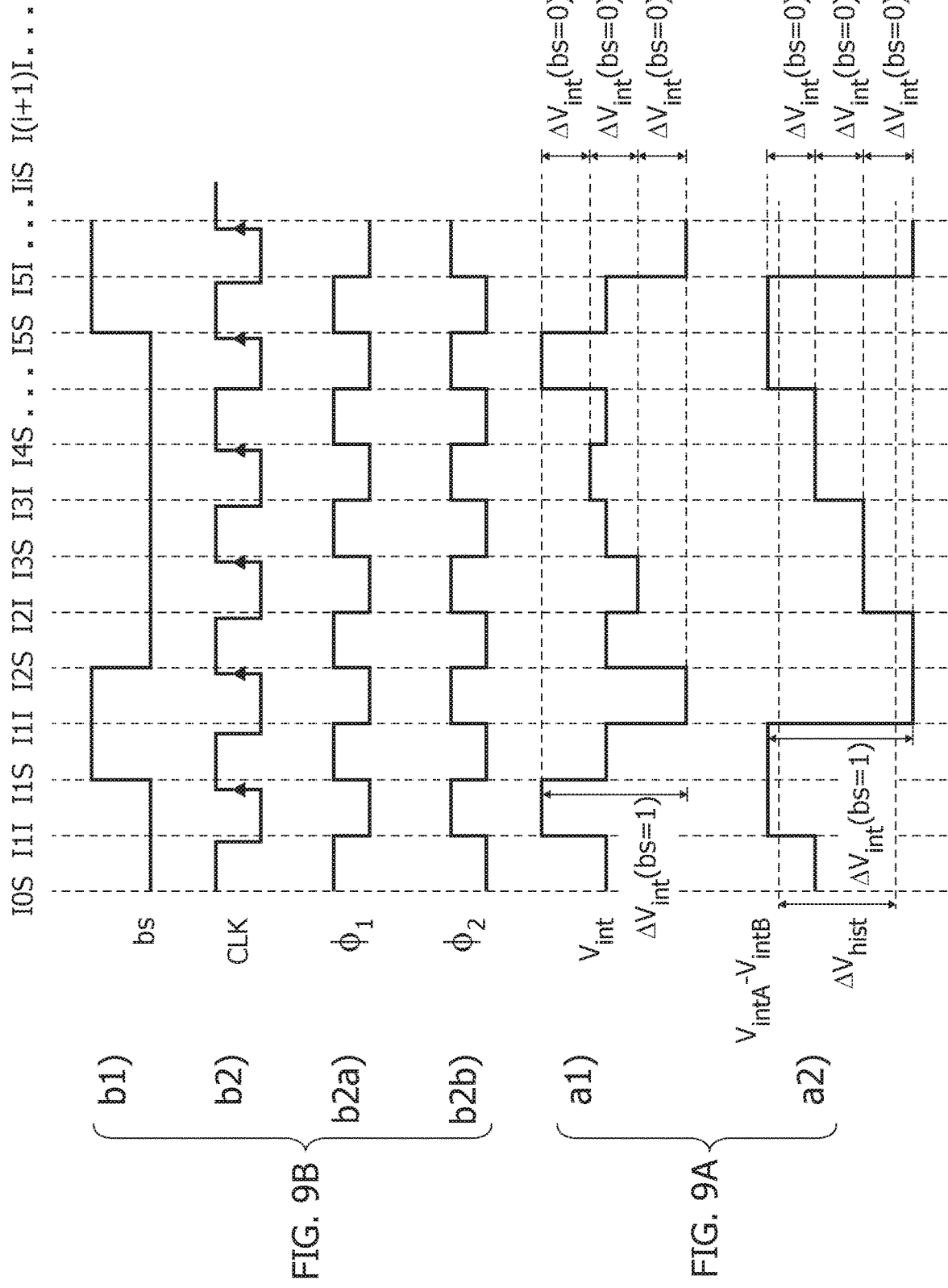

SENSOR CIRCUIT, CORRESPONDING SYSTEM AND METHOD

CROSS-REFERENCE TO RELATED APPLICATIONS

This application claims priority to Italian Patent Application No. 102018000004496, filed on Apr. 13, 2018, which application is hereby incorporated herein by reference.

TECHNICAL FIELD

The description relates to generally to temperature sensors.

BACKGROUND

Digital temperature sensors provide a digital output signal encoding information about the temperature sensed by a sensor circuit included in the temperature sensor.

To obtain a temperature-dependent output signal, a digital temperature sensor may include a first sub-circuit providing an analog temperature-dependent signal normalized to a voltage reference signal $V_{REF}$ followed by an analog-to-digital converter (ADC) sub-circuit where the temperature-dependent voltage signal is converted to a digital signal via the ADC. The temperature-dependent voltage signal is often referred to as Proportional To Absolute Temperature (PTAT) voltage $V_{PTAT}$.

The output of a digital temperature sensor may thus be a signal $D_{OUT}$ proportional to the ratio between a PTAT voltage and an (absolute) voltage reference $V_{REF}$ e.g. $D_{OUT}$ proportional to $V_{PTAT}/V_{REF}$.

So-called bandgap reference generators may represent a solution in the electronic field for providing absolute voltage references.

The reference voltage provided by a bandgap reference voltage circuit $V_{REF}$ (also indicated as bandgap reference voltage $V_{BG}$) may be a linear combination of a voltage with a Proportional To Absolute Temperature (PTAT) characteristic $V_{PTAT}$ and a voltage with a Complementary To Absolute Temperature (CTAT) characteristic $V_{CTAT}$, yielding a total voltage which is approximately constant across any temperature range i.e. an absolute temperature independent voltage reference.

Nevertheless, the CTAT voltage compensates only the linear dependence of PTAT voltage from temperature, while a non-linear dependence from temperature is still present in the output reference voltage $V_{REF}$ provided by a typical bandgap reference voltage. Such non-linear dependence from temperature may also be called "curvature". The temperature sensor accuracy over temperature variations is mainly limited by the aforementioned curvature. This consequently affects the linearity of the ADC output signal $D_{OUT}$. As a result, to design a high-accuracy temperature sensor it is essential to employ curvature-correction techniques.

A first way to improve the linearity of the ADC output signal $D_{OUT}$ linearity over temperature may be to employ a curvature correction technique for the reference voltage $V_{REF}$. When temperature accuracy is improved by reducing the curvature of the reference voltage, the way the reference is trimmed has a big influence on the accuracy that may be obtained. Voltage reference circuits may be trimmed to reduce the reference voltage non-linearity errors by adjusting the peak value of the reference voltage $V_{REF}$ so that it occurs at ambient temperature (approximately 300° K.), the parabolic curvature of the reference voltage is approximately symmetrical about the peak value within the operational temperature range.

Moreover, in addition to curvature other non-idealities may be present e.g. offset and mismatch. The way in which such additional non-idealities are addressed also affects the performance.

A second way may be to apply ratiometric curvature correction, as the curvature correction relies on the ratiometric nature of the temperature sensor output signal. In ratiometric curvature correction techniques, temperature error better than 0.2° C. can be achieved at the expense of introducing time multiplexing and doubling of AD converter.

Non-linearity can also be corrected in the digital domain, or at the system level. To correct for curvature in the digital domain, the digital circuitry may be modified to introduce an inverse non-linearity canceling the non-linearity resulting from curvature, using, for instance, a polynomial or piecewise linear transfer function. In digital and system-level curvature correction techniques, the correction involves both analogic and digital circuitry.

In system-level curvature correction, a parameter in the analog front-end (e.g., current of the transistor that generates the threshold voltage $V_{BE}$ or gain factor $\alpha$) may be adjusted by the digital circuitry in a temperature-dependent way so as to compensate for the curvature.

SUMMARY

Despite the extensive activity in that area, as witnessed, e.g., by various documents discussed in the following, further improved solutions are desirable. One or more embodiments can contribute in providing such an improved solution.

One or more embodiments may relate to a corresponding system. A system generating and processing a linearized temperature sensing digital signal may be exemplary of such a system.

One or more embodiments may relate to a corresponding method.

One or more embodiments may facilitate a robust and simple design of high-accuracy temperature sensors.

One or more embodiments may offer one or more of the following advantages:
 integration of the curvature correction within the ADC converter
 insensitivity of the performance to non-idealities such as offset and mismatch
 reduced temperature error.

BRIEF DESCRIPTION OF THE DRAWINGS

One or more embodiments will now be described, by way of example only, with reference to the annexed figures, wherein:

FIG. 8, which includes FIGS. 8A and 8B, includes time diagrams of signals which may occur in embodiments.

FIG. 9, which includes FIGS. 9A and 9B, includes time diagrams of signals which may occur in embodiments.

DETAILED DESCRIPTION OF ILLUSTRATIVE EMBODIMENTS

In the ensuing description, one or more specific details are illustrated, aimed at providing an in-depth understanding of examples of embodiments of this description. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is included in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The references used herein are provided merely for convenience and hence do not define the extent of protection or the scope of the embodiments.

The designation "smart sensor" is often applied to a device which receives some sort of input from the physical environment and is capable of producing (and possibly conditioning) corresponding signals to be transmitted to a control network.

Smart sensors facilitate accurate and automated collection of, e.g., environmental data and may be applied to monitoring and controlling a variety of environments, e.g. smart grids, for, e.g., exploration, science applications.

One or more embodiments may be applied to the curvature-correction of the temperature measurement produced by a digital temperature sensor.

Figure 1:
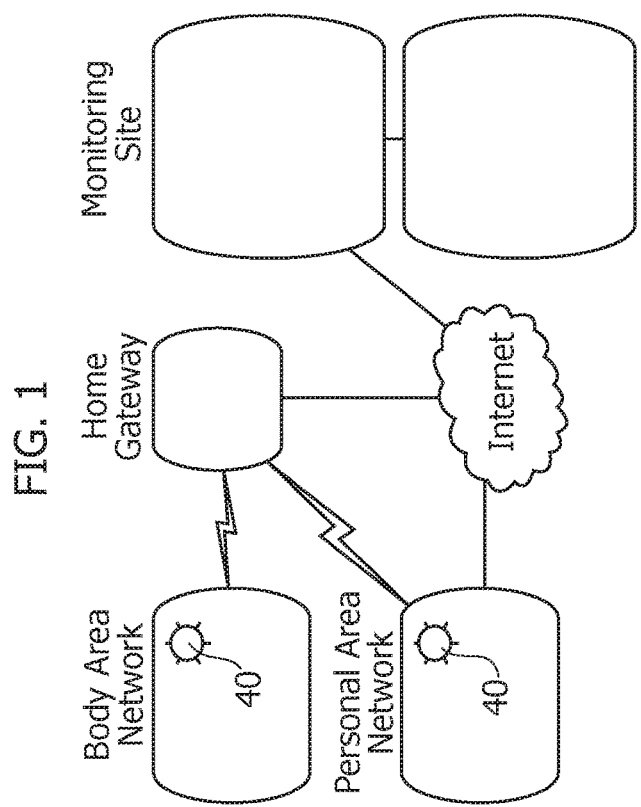
FIG. 1 is a schematic representation of temperature sensors in a networking arrangement.

FIG. 1 is a schematic representation of a sensor hub including a plurality of temperature sensors.

A smart sensor may be included in an Internet of Things (IoT) network, e.g., as a member of a sensor hub in a personal area network. A personal area network may include environmental sensors deployed around mobile devices. Environmental sensors, like temperature and humidity sensors, may provide contextual information, providing, e.g., location information.

The sensor hub or the personal area network may include a plurality of, e.g., temperature sensors 40. Such a temperature sensor may be an important part within a sensor hub.

One or more embodiments may be used in various products for portable devices (e.g., temperature sensitive devices, combined gas-humidity-temperature sensors) including sensors for sensing human body temperatures.

One or more embodiments may used be smart sensor devices where an accurate temperature reading over a wide temperature range may be required.

Figure 2:
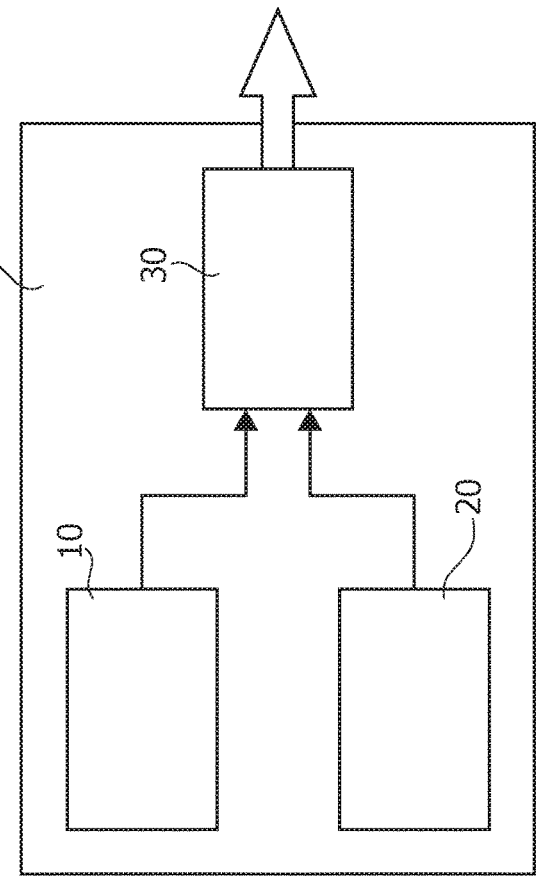
FIG. 2 is a block diagram of a temperature sensor.

FIG. 2 is an exemplary block diagram of a temperature sensor.

In one or more embodiments, as exemplified herein, a temperature sensor 40 may include a temperature sensor circuit 10 having associated bias circuitry 20 and an analog-to-digital converter (ADC) 30.

The temperature sensor circuit 10 may be configured to provide a signal Proportional To Absolute Temperature (PTAT).

The bias circuitry 20 may be configured for providing supply lines for the temperature sensor 10 and/or the ADC circuit 30.

The ADC converter 30 may be configured for providing a (digital) temperature readout signal DOUT containing information on the temperature measured by the temperature sensor 10. The temperature readout signal Dout may result from the processing of at least one analog signal received by the temperature sensor circuit 10 which may be proportional to the ratio of a temperature dependent voltage VPTAT to a reference voltage VREF.

Figure 3:
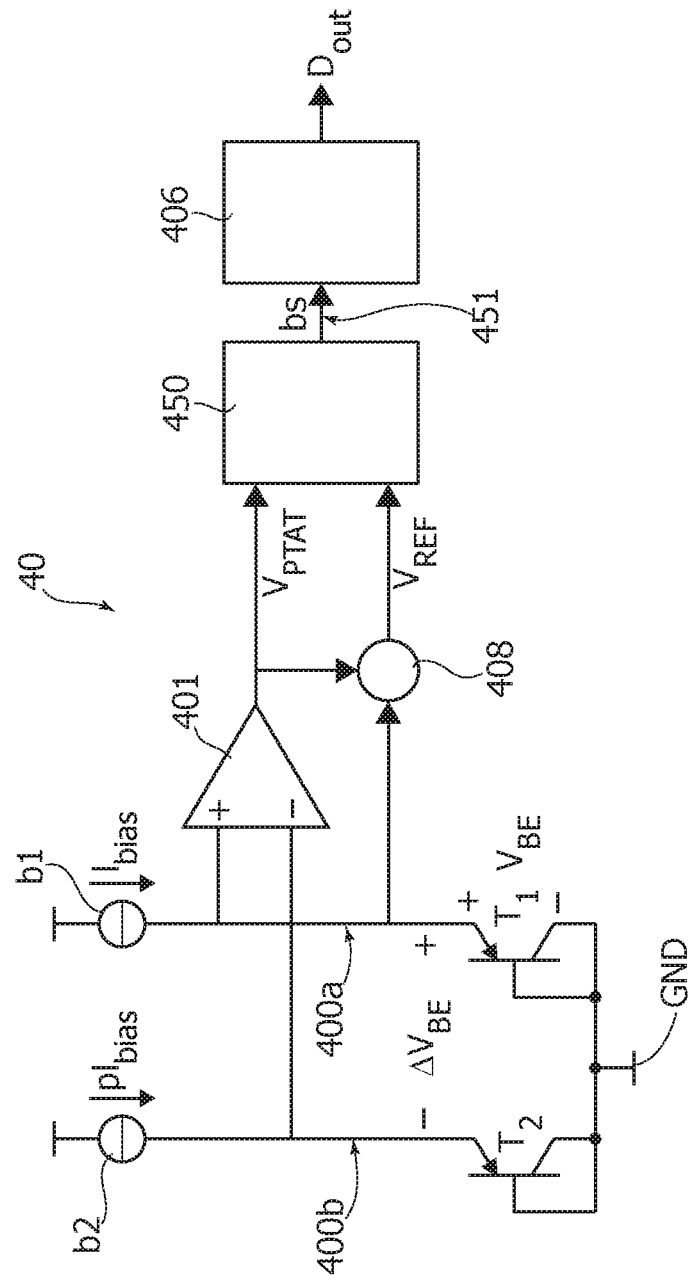
FIG. 3 is a circuit diagram exemplary of a temperature sensor.

FIG. 3 is exemplary of the principle of operation a (digital) temperature sensor 40 adapted to be implemented using CMOS technology.

In one or more embodiments, two (e.g., pnp) bipolar transistors T1, T2 in a diode-connection arrangement (control terminal e.g. base shorted to the current path, e.g. respective base nodes connected to the respective emitter nodes) may be coupled between respective biasing sources b1, b2 (of any known type) providing (different) biasing currents pIbias, Ibias and a (common) ground terminal GND.

In one or more embodiments, the first current source b1 may be configured to generate a first current Ibias in a first current line 400a through the first diode-connected transistor T1.

In one or more embodiments, the second current source b2 may be configured to generate a second current pIbias in a second current line 400b through the second diode-connected transistor T2.

In an arrangement as shown in FIG. 3, the biasing currents pIbias, Ibias may be proportional to each other. For instance, the second current pIbias may be proportional to the first current Ibias via a proportionality factor p e.g. pIbias=p·Ibias, the proportionality factor p being a multiple of unity.

Various arrangements may be devised in order to facilitate obtaining a current pIbias which mirrors (e.g. is identical or proportional to) the current Ibias produced by the generator b1. These arrangements are per se conventional in the art, thus making it unnecessary to provide a detailed description herein.

The two diode-connected transistors T1, T2 may facilitate generating various voltages.

According a transistor model, the base-emitter voltage drop (diode-drop, in the case of a diode-connected transistor) is a function of temperature and can be expressed as:

$$V_{BE}(T) = \frac{kT}{q}\ln\left(\frac{I_C}{I_S}\right) = V_{gO} + \frac{kT}{q}\ln\left(\frac{I_C}{A_E \cdot C \cdot T^\eta}\right)$$

where
- Vgo: extrapolated silicon bandgap at zero Kelvin degrees (0° K.),
- k: Boltzmann constant,
- T: absolute temperature in Kelvin degrees (° K.),
- q: is the electron charge (i.e., the magnitude of the electric charge carried by a single electron),
- IC: collector current,
- IS: reverse saturation current, $A_E$: (e.g. emitter, source) area of the transistor,
C: process dependent constant,
η: process dependent temperature coefficient,
g: proportionality factor between respective bias currents of the two transistors T1,T2, for example, g=Ib2/Ib1.

In one or more embodiments, the voltage drops across the first diode-connected transistor T1 and the second diode-connected transistor T2 may provide a voltage difference ΔVBE, which (again according to well-known transistor models) can be expressed as a function of temperature as:

$$\Delta V_{BE}(T) = V_{BE,1} - V_{BE,2} = \frac{kT}{q}\ln\left(\frac{I_{C,1}}{I_{C,2}}\right) = VT\ln(g)$$

where:
VT=kT/q is the thermal voltage, with k the Boltzmann constant, T the absolute temperature in Kelvin (° K.), and q the electron charge.

The equation above shows that ΔVBE is linearly dependent on absolute temperature T.

Thus, the voltage drops VBE and ΔVBE have a CTAT (Complementary To Absolute Temperature) and a PTAT (Proportional To Absolute Temperature) characteristic, respectively.

In an arrangement as exemplified in FIG. 3, a combination of the CTAT (e.g. VBE) and PTAT (e.g. ΔVBE) voltages may be used to produce a voltage VREF, e.g., VREF=VBE+α·ΔVBE where a may be the same scaling factor of the PTAT voltage VPTAT.

The scaling factor α value may be used to calibrate the temperature sensor, by amplifying or adjusting the sensor output voltage.

In an arrangement as exemplified in FIG. 3, the circuit 40 further includes a first differential stage 401 (e.g., an op-amp) having a (first) gain factor α and an adder block 408.

In an arrangement as exemplified in FIG. 3, the differential stage 401 may have a first (e.g., non-inverting) input coupled to the first transistor T1 and a second (e.g., inverting) input coupled to the second transistor T2.

For instance, the differential stage 401 may be sensitive to the difference ΔVBE of the respective voltage drops across the first diode-connected transistor T1 and the second diode-connected transistor T2 and may provide an output signal VPTAT proportional to absolute temperature, e.g., VPTAT=α·ΔVBE where a may be the gain factor of the first differential stage 401.

As shown herein, the adder block 408 may be coupled to the transistor T2 and to the output of the differential stage 401.

The adder block 408 may receive (at input) the signal provided at output by the differential stage 401, and the voltage drop VBE across the second diode-connected transistor T2.

The adder block 408 may provide at output a reference signal VREF equal to the sum of the received input signals e.g. VREF=VBE+α·ΔVBE. The adder block 408 may provide the reference signal VREF to an analog-to-digital converter (ADC) stage 450.

In an arrangement as exemplified in FIG. 3, the analog-to-digital converter (ADC) stage 450 may be coupled to the first differential stage 401 and the adder block 408. The ADC stage 450 may be sensitive to the signal VPTAT and to the reference signal VREF and may provide at output an output bitstream bs, having an average value μ, providing a (digital) temperature sensing signal.

In one or more embodiments, the ADC stage 450 may use a reference voltage VREF to convert (analog) signal VPTAT into an output bitstream bs.

In an arrangement as exemplified in FIG. 3, the (analog) signal VPTAT may be first sampled to produce a discrete-time signal and then the discrete-time signal may be quantized into a finite number of quantization levels to produce the bitstream bs. If the bitstream bs includes N bits, VPTAT is quantized into an N-th power of two (2N) levels, with each level separated by a quantization step size. The reference voltage VREF provides the range of conversion for the ADC so that input signal VPTAT may range from 0 to +VREF (or from −VREF to +VREF for a bipolar ADC). If VPTAT is equal to or larger than VREF, commonly referred to as the full-scale input, bitstream bs includes only ones; if VPTAT is equal to or smaller than 0/−VREF, bitstream bs includes only zeros. For VPTAT between these two voltage levels, bitstream bs includes a sequence of binary numbers corresponding to the VPTAT signal levels such that a change in VPTAT of a quantization step size of Q=VREF/2N corresponds to a 1-bit change in the least significant bit ("LSB") of bitstream bs.

The ADC stage 450 may include an integrator stage, a comparator and a feedback network. For instance, the ADC stage 450 may selectively receive at input either the VPTAT or the VREF signal as a function of the output signal provided across the feedback network. Thus, the feedback network may enforce the condition that the output bitstream bs digital signal value is the ratio of the signal VPTAT to the reference signal VREF e.g. VPTAT/VREF.

In an arrangement as exemplified in FIG. 3, the ADC stage 450 may be coupled to a scaling circuit block 406.

In an arrangement as exemplified in FIG. 3, the scaling circuit block 406 may be coupled to ADC stage 450. The scaling circuit block 406 may receive at input the bitstream bs provided by the ADC stage 450 and may provide at output a temperature readout signal DOUT proportional to the ratio of the signal VPTAT to the reference signal VREF.

In an arrangement as exemplified in FIG. 3, the temperature readout signal DOUT can be expressed as a function of temperature as:

$$D_{OUT} = A \cdot \frac{V_{PTAT}}{V_{REF}} - B = A \cdot \frac{\alpha \cdot V_T \cdot \ln(g)}{V_{gO} + V_T \cdot \ln\left(\frac{I_C}{A_E \cdot C \cdot T^\eta}\right) + \alpha \cdot V_T \cdot \ln(g)} - B$$

where the various entities in the formula indicate parameters already partially introduced in the foregoing, namely:
k: Boltzmann constant,
T: absolute temperature in Kelvin degrees (° K.),
q: electron charge (i.e. the magnitude of the electric charge carried by a single electron),
IC: collector current,
IS: reverse saturation current,
AE: (e.g. emitter, source) area of the transistor,
C: process dependent constant,
η: process dependent temperature coefficient,
A and B: real numbers.

In an arrangement as exemplified in FIG. 3, the coefficients A and B of the scaling circuit block 406 may be chosen as to obtain the digital temperature reading $D_{OUT}$ corresponding to temperature scaled to any temperature scale e.g. A=600, B=273 so as to obtain a digital output in degrees Celsius.

In an arrangement as exemplified in FIG. 3, the scaling circuit block 406 may include a decimation filter.

The accuracy of a temperature sensor circuit 40 as exemplified in FIG. 3 may affected by a non-linear temperature dependence (also called "curvature") of the diode-drop voltage VBE(T) in the diode-connected transistors, which may affect VREF and hence the linearity over temperature of the readout signal DOUT.

As a result, absent a curvature correction, the accuracy of an arrangement 40 as exemplified in FIG. 3 may not be as desired.

The design of a high-accuracy temperature sensor may thus involve "curvature-correction" techniques to compensate (higher-order) non-linearities.

Various curvature-correction techniques are discussed in the technical literature.

Documents such as the following are exemplary of such literature:

M. A. P. Pertijs, and J. H. Huijsing, "Precision Temperature Sensor in CMOS technology", chapter 3-paragraph 5, Springer Science & Business Media;

M. A. P. Pertijs, A. Bakker, and J. H. Huijsing, "A high-accuracy temperature sensor with second-order curvature correction and digital bus interface," in Proc. ISCAS, May 2001, pp. 368-371;

P. Malcovati, C. A. Leme, P. O'Leary, F. Maloberti, and H. Baltes, "Smart sensor interface with A/D conversion and programmable calibration," IEEE Journal of Solid-State Circuits, vol. 29, no. 8, pp. 963-966, August 1994; U.S. Pat. No. 6,456,145 B1.

It is observed that a reference voltage VREF may be first-order compensated (i.e. that the temperature coefficient (TC) of VREF is zero at a reference temperature Tr). This condition may be achieved, e.g., if VREF(T0) equals Vgo (which is about 1.25V).

This may not be adequate in terms of ADC converter output, as this may lead to a quadratic non-linearity and to an error of almost 1 Celsius degree (° C.) (e.g., in a temperature range from −55° C. to 130).

For instance, if VREF(Tr) is increased (about to 1.29V), its TC becomes slightly positive. The temperature readout signal DOUT non-linearity may then still include a third-order term leading to an error of, e.g., 0.2° C. (e.g., in the temperature range from −55° C. to 130). Stated otherwise, reducing the non-linearity error in the temperature readout signal DOUT by compensating the second-order non-linearity still leaves a third-order nonlinearity extant.

This type of "ratiometric" curvature correction may reduce non-linearity appreciably (e.g., to inaccuracies in the order of ±0.1° C.) by using higher-order ratiometric correction. This is however at the possible cost of time multiplexing and/or doubling the ADC converter. In fact, in ratiometric curvature correction techniques, temperature errors better than 0.2° C. can be achieved (only) by using at least a third-order ratiometric correction, thus leading to more complexity.

Figure 4:
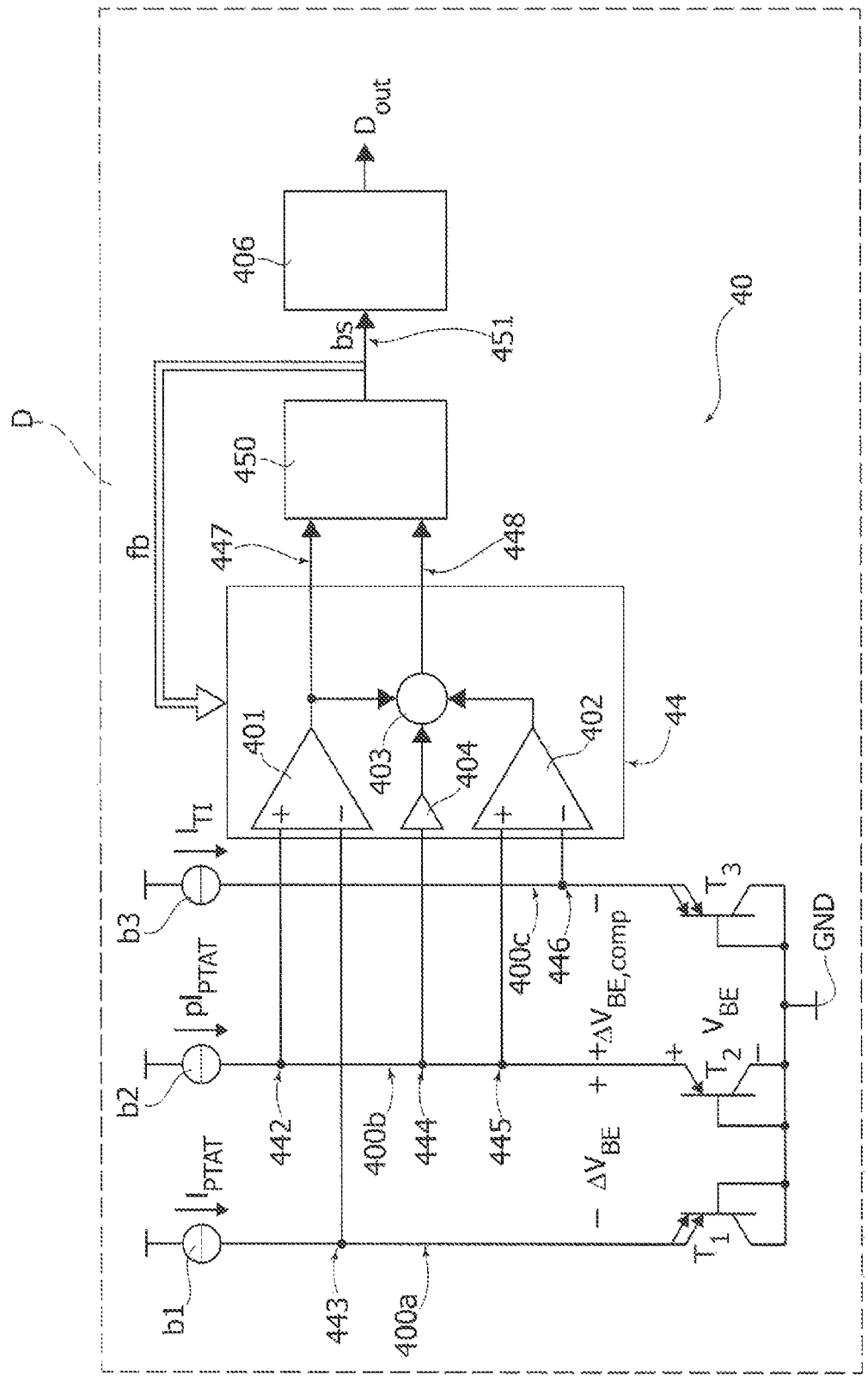
FIG. 4 is a circuit diagram exemplary of embodiments.

FIG. 4 is exemplary of the principle of operation a temperature sensor 40 according to embodiments.

Unless otherwise discussed in the following, in FIG. 4 (and in FIG. 7 as well) parts or elements like parts or elements already discussed in the foregoing are indicated with like reference/numerals, so that a corresponding detailed description will not be repeated here for brevity.

Briefly, in one or more embodiments, a first current source b1 may be used to provide a biasing current IPTAT in a first current line 400a and a second current source b2 may be used to provide a biasing current pIPTAT in a second current line 400b in order to bias a first diode-connected transistor T1 and a second diode-connected transistor T2, respectively.

Various arrangements may be devised in order to facilitate obtaining a current pIPTAT which mirrors (e.g., is identical or proportional to) the current IPTAT produced by the generator b1. These arrangements are per se conventional in the art, thus making it unnecessary to provide a detailed description herein.

In one or more embodiments, the first current source b1 may be configured to generate a first current Ibias in a first current line 400a through the first diode-connected transistor T1.

In one or more embodiments, the second current source b2 may be configured to generate a second current pIbias in a second current line 400b through the second diode-connected transistor T2.

One or more embodiments as exemplified in FIG. 4 may include a Temperature Independent (TI) current source b3 providing a TI current ITI in a third current line 400c, biasing a third diode-connected transistor T3.

Such a TI current source b3 may be provided by any known means for that purpose, e.g. by a circuit providing a weighted sum of a PTAT and CTAT reference currents.

To that effect, in one or more embodiments, a third (e.g., pnp) bipolar transistor T3 in a diode-connection arrangement (control terminal e.g. base shorted to the current path, e.g. respective base nodes connected to the respective emitter nodes) may be coupled between a respective biasing source b3 (again of any known type) providing a biasing current ITI and the (common) ground terminal GND.

The generators b1, b2 or b3 may be implemented according to any known solution for that purpose, thus making it unnecessary to provide herein a detailed description of those circuit blocks.

In one or more embodiments, the diode-connected transistors T1, T2 and T3 may differ from each other for at least one of two factors: the transistor area AT1, AT2, AT3, respectively, and the bias current IPTAT, pIPTAT, ITI therethrough.

In one or more embodiments, the transistor T1 may have an (emitter) area AT1 proportional to a given (emitter) area reference value AE via a first area proportionality factor r, e.g. a proportionality factor r multiple of unity, yielding AT1=r·AE.

In one or more embodiments, the transistor T2 may have an (emitter) area AT2 proportional to a given area value AE via a second area proportionality factor, e.g. a unitary proportionality factor AT2=1·AE.

In one or more embodiments, the transistor T3 may have an (emitter) area AT3 proportional to a given area value AE via a third area proportionality factor s, e.g. a proportionality factor s multiple of unity, yielding AT3=s·AE.

In one or more embodiments, a further voltage difference $\Delta V_{BE,comp}$ may thus be generated as the difference of the voltage drop VBE across the second diode-connected transistor T2 and the voltage drop across the third T3 diode-connected transistor.

The voltage drop $V_{BE}$, the voltage difference $\Delta V_{BE}$ and the voltage difference $\Delta V_{BE,comp}$ can be expressed as functions of temperature as:

$$V_{BE}(T) = V_{g0} + V_T \cdot \ln\left(\frac{pI_{PTAT}}{A_E \cdot C \cdot T^\eta}\right)$$

$$\Delta V_{BE}(T) = V_T \cdot \ln(p \cdot r)$$

-continued $$\Delta V_{BE,comp}(T) = V_T \cdot \ln\left(p \cdot s \cdot \frac{I_{PTAT}}{I_{TI}}\right)$$

where the various entities in the formulas indicate the parameters, partially already introduced in the foregoing, namely:

Vgo: extrapolated silicon bandgap at zero Kelvin degrees (0° K.),

VT=kT/q: thermal voltage, with k the Boltzmann constant, T the absolute temperature in Kelvin (° K.), and q the electron charge C: process dependent constant, η: process dependent temperature coefficient, specific for each technology, AE: given (emitter) area value, r: ratio between the area of the transistor T1 and the given area AE, s: ratio between the area of the transistor T3 and the given area AE, and p: proportionality factor between bias currents $pI_{PTAT}$, $I_{PTAT}$ e.g. $P=I_{PTAT}/I_{PTAT}$.

In the exemplary embodiment of FIG. 4, the circuit 40 further includes to that effect a selection stage 44, having:

a first input node 442 coupled to the second diode-connected transistor T2, a second input node 443 coupled to the first diode-connected transistor T1, a third input node 444 coupled to the second diode-connected transistor T3, a fourth input node 445 coupled to the second diode-connected transistor T2, and a fifth input node 446 coupled to the third diode-connected transistor T3.

The selection stage 44 may thus be sensitive to:

the difference $\Delta V_{BE}$ of the respective voltage drops across the first diode-connected transistor T1 and the second diode-connected transistor T2, at the input nodes 442 and 443, the voltage difference $\Delta V_{BE,comp}$, at the input nodes 445 and 446, and the voltage drop $V_{BE}$ across the second diode-connected transistor T2, at the input node 444.

The selection stage 44 may be coupled, at nodes 447 and 448, to a sigma-delta analog-to-digital converter (ADC) 450 downstream, whose characteristics will be detailed in the following.

The selection stage 44 may have further input nodes configured to receive the output bitstream bs from the output node 451 of the sigma-delta ADC 450 downstream, thereby implementing a feedback loop via a feedback network fb.

The feedback network fb may be configured to operate various switches to selectively couple the (input/output) nodes 442, 443, 444, 445, 446, 447, 448 to the selection stage 44.

In an arrangement as exemplified in FIG. 4, the selection stage 44 may include a first differential stage 401, a second differential stage 402, a combination network 403 and a (e.g., unitary gain) signal propagation path 404 for the second transistor T2.

In an arrangement as exemplified in FIG. 4, the first input node 442 and the second input node 443 may be coupled to the differential stage 401, having a (first) gain a. For instance, the differential stage 401 may be sensitive to the difference $\Delta V_{BE}$ of the respective voltage drops across the first diode-connected transistor T1 and the second diode-connected transistor T2 and may provide a first (output) signal $V_{PTAT}$ proportional to absolute temperature e.g. $V_{PTAT}=\alpha \cdot \Delta V_{BE}$ where a may be the gain factor of the first differential stage 401.

In an arrangement as exemplified in FIG. 4, the fourth input node 445 and the fifth input node 446 may be coupled to the second differential stage 402, having a second gain factor β. For instance, the differential stage 402 may thus be sensitive to the voltage difference $\Delta V_{BE,comp}$, whereas it may provide at output a second PTAT (output) signal $V_\beta$ linearly proportional to the input e.g. $V_\beta = \beta \cdot \Delta V_{BE,comp}$, where β is the gain factor of the second differential stage 402.

In an arrangement as exemplified in FIG. 4, the third input node 444 may be coupled to the signal propagation path 404 for the second transistor T2.

In an arrangement as exemplified in FIG. 4, the first differential stage 401, the second differential stage 402, the third input node 444 and the signal propagation path 404 may be coupled to the combination network 403. For instance, the combination network 403 may be sensitive to the output signal $V_{PTAT}$ from the first differential stage 401, the output signal $V_\beta$ from the second differential stage 402 and to the voltage drop $V_{BE}$ across the second diode-connected transistor T2.

In one or more embodiments, the voltages $V_{BE}$, $V_\beta$ and $V_{PTAT}$ may be combined in the combination network 403 (e.g. by using a superposition principle) to generate a voltage $V_{REF\_LIN}$ which, together with $V_{PTAT}$ can be processed in the sigma-delta analog-to-digital converter (sigma-delta ADC) 450. For instance, the combination network 403 may receive (at input) the first signal $V_{PTAT}$, the second signal $V_\beta$ and the voltage drop $V_{BE}$ and may provide (at output) a reference voltage $V_{REF\_LIN}$ by combining the (input) signals $V_{PTAT}$, $V_{BE}$ and $V_\beta$ e.g. $V_{REF\_LIN}=V_{BE}+V_\beta+V_{PTAT}=V_{BE}+\beta \cdot \Delta V_{BE,comp}+\alpha \cdot \Delta V_{BE}$. [ono] It will be appreciated that combination network 403 is exemplified herein primarily by way of simplicity and ease of understanding. Consequently, it may represent primarily a functional block presented for the sake of explanation, without having to be necessarily mirrored by a corresponding "physical" circuit portion. For instance, in one or more embodiments, the combination network 403 may be provided as a part of a circuit configured to combine in any combination (e.g a weighted sum) the signals $V_{BE}$, $\Delta V_{BE}$ and $\Delta V_{BE,comp}$, e.g. as discussed in the following in connection with FIG. 7.

In one or more embodiments, the PTAT and TI bias currents $I_{PTAT}$, $I_{TI}$ may exhibit certain properties such as being proportional to temperature and constant, respectively.

For instance:

$$I_{PTAT}(T)=aT \text{ and } I_{TI}=b,$$

where:

a, may be a proportionality coefficient (Ampere/° K.)

b may be a fixed current value having units (Ampere).

Substituting the aforementioned equation in the equation of the reference voltage $V_{REF\_LIN}$, yields the relationship:

$$V_{REF\_LIN} = V_{gO} + V_T \cdot \ln\left(T^{1-\eta+\beta} \cdot \frac{pa}{A_E \cdot C} \cdot \left(\frac{psa}{b}\right)^\beta \cdot (pr)^\alpha\right)$$

where the various entities in the formula indicate the parameters already introduced in the foregoing, namely:

$V_{gO}$=extrapolated silicon bandgap at zero Kelvin degrees (0° K.), $V_T = kT/q$ is the thermal voltage, with k the Boltzmann constant, T the absolute temperature in Kelvin (° K.), and q the electron charge C=process dependent constant, η=process dependent temperature coefficient, $A_E$=given (emitter) area value, r=ratio between the area of the transistor T1 and the given area $A_E$, s=ratio between the area of the transistor T3 and the given area $A_E$, p=proportionality factor between respective bias currents of the two transistors T1, T2 e.g. $p=I_{b2}/I_{b1}$, a=proportionality coefficient having units (A/° K.)

b=fixed current having units A, and

α and β represent rational numbers whose value can be set as discussed in the following.

In order to obtain a reference voltage $V_{REF\_LIN}$ constant in (notionally) any temperature range the following relationship should apply, for any real value of temperature T:

$$V_{REF\_LIN} = V_{gO} \rightleftharpoons T^{1-\eta+\beta} \cdot \frac{pa}{A_E \cdot C} \cdot \left(\frac{psa}{b}\right)^\beta \cdot (pr)^\alpha = 1$$

The equation discussed above can be satisfied by selecting for a α value providing a zero-temperature coefficient for $V_{REF\_LIN}$ and a value for β selected to correct the temperature curvature e.g. by imposing that the coefficients α and β contemporarily satisfy the relation:

$$\begin{cases} 1-\eta+\beta = 0 \\ \frac{pa}{A_E \cdot C} \cdot \left(\frac{psa}{b}\right)^\beta \cdot (pr)^\alpha = 1 \end{cases}$$

The coefficient named a is thus selected to provide a zero-temperature coefficient for $V_{REF\_LIN}$, whereas the coefficient designated β is chosen to correct the temperature sensor curvature.

When α and β satisfy the system reported above, the resulting expression of the reference voltage $V_{REF\_LIN}$ is $V_{REF\_LIN}=V_{go}$=constant for any value of temperature T, resulting in a temperature independent curvature-corrected reference voltage. The coefficients a and b of the $I_{PTAT}$ and $I_{TI}$ bias current could be chosen to satisfy the equation above, as well as the area ratios r and s.

In one or more embodiments, the sigma-delta ADC 450 may be coupled to the selection stage 44 via the nodes 447, 448. In one exemplary embodiment as reproduced in FIG. 4, the sigma-delta ADC 450 input may be sensitive to the output signal VPTAT from the output node 447 and to the output signal VREF_LIN from the output node 448, the sigma-delta ADC 450 being configured to provide at the output node 451 a bitstream bs.

In one or more embodiments, the sigma-delta ADC 450 may calculate the signal ratio of (at least one of) the input signals received from the nodes 447 and 448 to an (internal) reference signal, and provide the aforementioned signal ratio to an output in the form of a bitstream bs.

This process may be repeated iteratively, providing a bitstream bs of "1" and "0" output signals having an average μ.

In one or more embodiments, a feedback network fb may couple the output node 451 of the sigma-delta ADC 450 to the selection stage 44, imposing a closed loop condition for which the average p of the output bitstream bs may be equal to the ratio of the (output) signal VPTAT and the reference signal VREF_LIN, which are respectively a high-linearity PTAT signal and a temperature-independent and curvature-corrected reference signal. Thus, the average may have a linear dependence from absolute temperature in any temperature range.

In one or more embodiments, the output node 451 of the sigma-delta ADC 450 may be coupled to a scaling circuit block 406. Again, the temperature readout signal DOUT provided at output by the scaling circuit 406 may represent a scaled temperature reading of the temperature sensor 40 e.g. in Celsius degrees.

Figure 5:
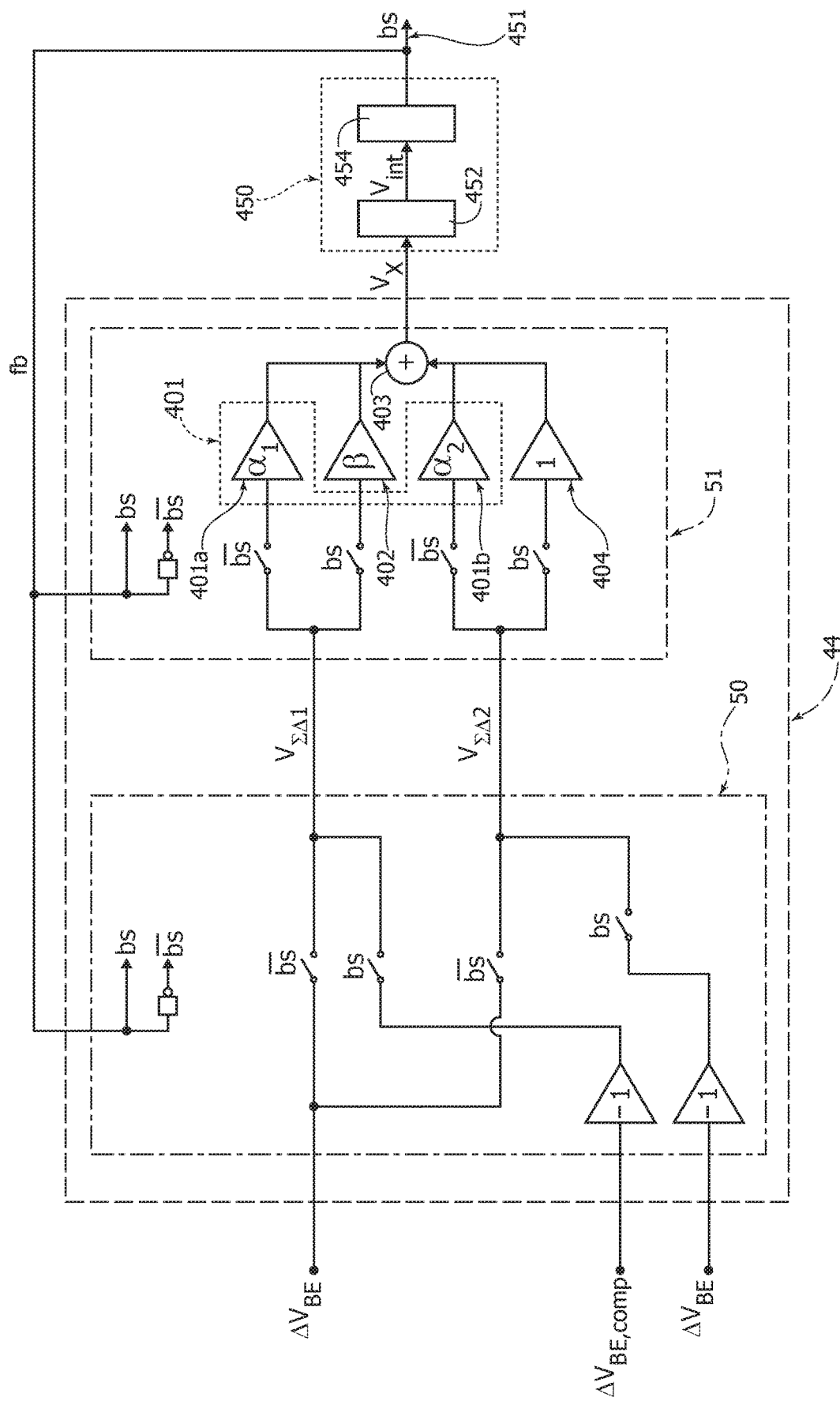
FIG. 5 is a block diagram exemplary of a sigma-delta analog-to-digital converter.

FIG. 5 illustrates an exemplary diagram of a processing network including a selection stage 44, a sigma-delta ADC 450 and a feedback network fb as already introduced in connection with FIG. 4.

It will be appreciated that, for the sake of simplicity, identical designations may be used herein for designating both certain circuit nodes and signals occurring at those nodes.

In one or more embodiments as exemplified in FIG. 5, the selection stage 44 may receive as inputs the difference ΔVBE of the respective voltage drops across the first diode-connected transistor T1 and the second diode-connected transistor T2, the voltage difference ΔVBE,comp and the voltage drop VBE across the second diode-connected transistor T2.

In one or more embodiments as exemplified in FIG. 5, the selection stage 44 may provide at least one signal Vx to the sigma-delta ADC 450.

In one or more embodiments the signals ΔVBE, ΔVBE, comp and VBE may be voltage signals.

In an exemplary arrangement as presented in FIG. 5, the feedback network fb may couple the output node 451 of the sigma-delta ADC 450 to the selection stage 44. For instance, the feedback network fb may control operation of a switching arrangement 50, 51 to selectively couple (at least one of) the input nodes $\Delta V_{BE}$, $\Delta V_{BE,comp}$ and $V_{BE}$ to the sigma-delta ADC 450.

In one or more embodiments as exemplified in FIG. 5, a first portion 50 of the switching arrangement may provide signals $V_{\Sigma\Delta 1}$, $V_{\Sigma\Delta 2}$ to a second portion 51 of the switching arrangement.

For instance, the first portion 50 may include a pair of parallel switches (e.g. electronic switches, such as a MOSFET transistor), a pair of parallel switches $\overline{bs}$, a pair of sign inverters to alternatively provide at output:

the signals $V_{\Sigma\Delta 1}$, $V_{\Sigma\Delta 2}$ having a same signal value, e.g. $V_{\Sigma\Delta 1}=V_{\Sigma\Delta 2}=\Delta V_{BE}$, when bs has a first value, e.g. bs="0", or the signals $V_{\Sigma\Delta 1}$, $V_{\Sigma\Delta 2}$ having different signals values, e.g. $V_{\Sigma\Delta 1}=-\Delta V_{BE,comp}$ and $V_{\Sigma\Delta 2}=-V_{BE}$, when bs has a second value, e.g. bs="1".

In one or more embodiments as exemplified in FIG. 5, the second portion 51 of the switching arrangement may include a pair of parallel switches bs and a switch $\overline{bs}$, to alternatively couple:

the signal $V_{\Sigma\Delta 1}$ to the first differential stage 401 and the signal $V_{\Sigma\Delta 2}$ to the combination network 403 when bs has a first value, e.g. bs="0", or the signal $V_{\Sigma\Delta 1}$ to the second differential stage 402 and the signal $V_{\Sigma\Delta 2}$ to the first differential stage 401 when bs has a second value, e.g. bs="1".

In one or more embodiments as exemplified in FIG. 5, the first differential stage 401 may include a pair of differential stages 401a and 401b, having gain factors $\alpha_1$, $\alpha_2$ respectively whose combination is equal to the first gain factor α, e.g. $\alpha_1=\alpha_2=\frac{1}{2}\cdot\alpha$ or $\alpha_1=\alpha$, $\alpha_2=0$.

In one or more embodiments as exemplified in FIG. 5, the signal $V_{\Sigma\Delta2}$ may be coupled to the signal propagation path 404 for the second transistor T2, e.g. having unitary gain, which may provide to the combination network 403 the signal $V_{\Sigma\Delta2}$ when bs has a second value e.g. bs="1".

In one or more embodiments as exemplified in FIG. 5, the "resulting" value $V_x$ at the combination network 403 as described in the foregoing may be expressed as:

$$V_x = (1-bs) \cdot V_{PTAT} - bs \cdot (V_{BE} + V_\beta) = \begin{cases} V_{PTAT} & \text{if } bs = \text{"0"} \\ -V_{BE} - V_\beta & \text{if } bs = \text{"1"} \end{cases}$$

In one or more embodiments as exemplified in FIG. 5, the sigma-delta ADC 450 may include a loop filter signal path extending from the combination network 403 to the output node 451 and including an integrator 452 and a comparator 454.

In the exemplary diagram of FIG. 5, the integrator 452 may provide an integrated signal $V_{int}$, which may be the integral of the "resulting" value $V_x$ provided at the combination network 403.

In the exemplary diagram of FIG. 5, the integrator 452 may be coupled to a comparator 454, arranged between the integrator 452 and the output node 451.

In one or more embodiments, the comparator 454 may operate with an internal reference (not visible) having a threshold interval $\Delta V_{hyst}$ at a (sample) frequency fs of a clock signal CLK (generated in a manner per se known).

For instance, the comparator 454 may receive at input the integrated signal $V_{int}$ and compare its value to a threshold interval $\Delta V_{hyst}$ for every period T=1/fs of the clock signal CLK, providing at output the signal bs which is set to have one of two alternative values:

a first value, indicated as "0", if the value of the integrated signal $V_{int}$ is below the lower bound of the threshold interval $\Delta V_{hyst}$, a second value, indicated as "1", if the value of the integrated signal $V_{int}$ is above the upper bound of the threshold interval $\Delta V_{hyst}$.

Thus, in an exemplary embodiment, the comparator 454 may provide at the output node 451 of the circuit 450 a bitstream bs which may be encoded as a bitstream of binary values at a frequency fs, that is a digital signal which takes a first value (e.g. "0") and a second value (e.g. "1") and is synchronous with the clock signal CLK.

In an exemplary embodiment as in FIG. 5, the (digital) bitstream bs may be coupled via the feedback network fb to the switching arrangement 50, 51 selectively propagating signals according to the foregoing.

It will be otherwise appreciated that (in one or more embodiments as discussed in the following, e.g. in connection with FIG. 7) the feedback network fb as well as various elements exemplified in FIG. 5 as distinct integers may be included (together with the differential stages 401 and 402) in a multiplexer/capacitor network.

In an exemplary embodiment as in FIG. 5, the feedback network fb creates a closed feedback loop, enforcing the condition that the time-average output (designated µ) of the output bitstream bs provided by the comparator 454 equates the average of the "resulting" value $V_x$.

For instance, the average of the "resulting" value may be expressed as the ratio between the "resulting" value $V_x$ and a number of samples n taken in a time interval T.

With such a control logic enforced by the feedback network fb, the average value of the output signal bs, namely µ, may be expressed as:

$$\mu = \frac{V_{PTAT}}{V_{BE} + V_\beta + V_{PTAT}} = \frac{V_{PTAT}}{V_{REF\_LIN}}$$

The average value p of the bitstream bs may be obtained in a manner known per se e.g. via a digital decimation filter.

Figure 6:
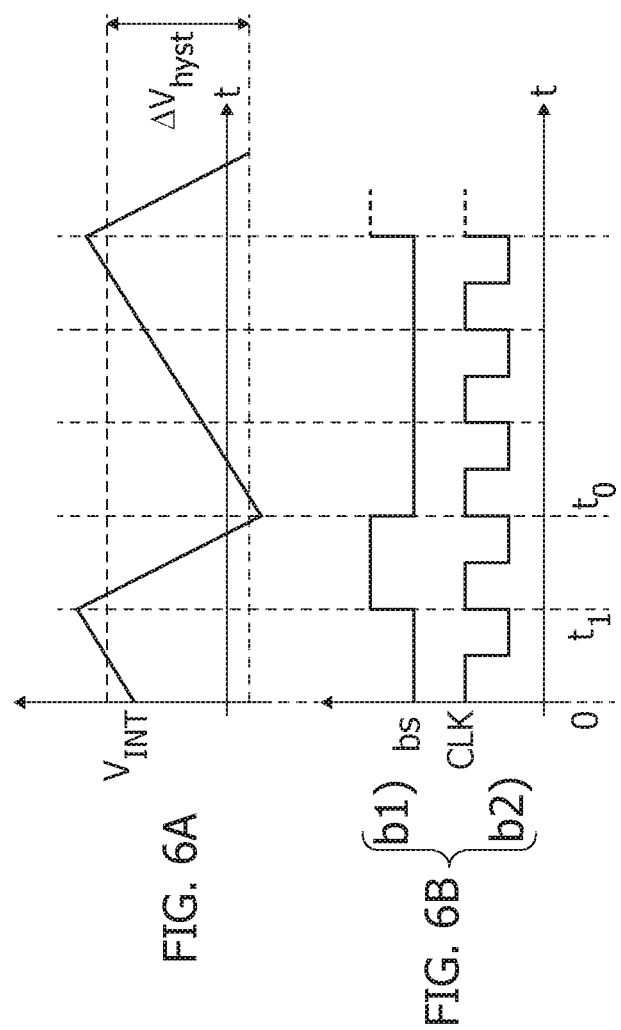
FIG. 6, which includes FIGS. 6A and 6B, includes time diagrams of signals which may occur in embodiments.

FIG. 6 illustrates an exemplary possible time diagram of the analog and digital signals which are processed (either e.g. received at input, provided at output, generated internally) by the sigma-delta ADC 450 of FIG. 5.

In FIG. 6:

portion a) shows a possible behavior of the analog integrated signal $V_{int}$, portion b) shows a possible behavior of the digital signals, wherein:

portion b1) shows a possible behavior of the bitstream bs, and portion b2) shows a possible behavior of the clock signal CLK, having frequency fs and period $t=t_0=1/fs$.

In the exemplary diagram of FIG. 6, the integrated signal $V_{int}$ may represent the (continuous time) integral of the "resulting" value $V_x$ starting from a reference time t=0, where the initial value (e.g. at t=0) of:

the "resulting" value $V_x$ is positive e.g. $V_x(t=0)>0$, the bitstream bs is equal to the first binary value "0" e.g. digital low value bs(t=0)="0", the integrated signal $V_{int}$ is below the upper bound of the threshold interval $\Delta V_{hyst}$, the clock signal CLK is equal to the second binary value "1" e.g. digital high value CLK(t=0)=1.

In this exemplary case, the integrated signal $V_{int}$ as a function of time is a line with slope equal to the initial value of the "resulting" value e.g. $V_{int}=V_x(t=0) \cdot t$.

Simultaneously with a change of the clock signal CLK value from digital low to high (on a rising clock front), e.g. at $t=t_1$, the comparator 454 may sample the integrated signal $V_{int}$ and check whether the sampled integral signal value e.g. $V_{int}(t=t_1)$ is within the boundaries of a threshold interval $\Delta V_{hyst}$. For instance, if the integrated signal $V_{int}(t=t1)$ is above the upper bound of the threshold interval $\Delta V_{hyst}$ the comparator 454 set bs to a digital high value, whereas if the integrated signal $V_{int}(t=t1)$ is below the lower bound of the threshold interval $\Delta V_{hyst}$ the comparator 454 set bs to a digital low value.

In the exemplary diagram of FIG. 6 for instance, e.g. at $t=t_1$:

the comparator 454 updates the bitstream bs value, which is updated e.g. from digital low to digital high, the switching arrangement 50,51 controlled by the feedback network fb, cause, e.g., the sum signal $V_\beta+V_{BE}$ provided (at output) by the combination network 403 to be provided (with a minus sign) to the integrator 452, consequently, the value of $V_x$ is also updated, e.g. to a new value having negative sign, in order to change the slope of the integrated signal $V_{int}$ of the integrator 452 and restore a value of the integrated signal $V_{int}$ within the comparator threshold interval $\Delta V_{hyst}$ bounds, and the integrated signal $V_{int}$ value is consequently updated and starts decreasing.

Similarly, in the exemplary diagram of FIG. 6, at e.g. at t=t₀, for instance:

the bitstream bs maintains its value, e.g. a digital high value, until the sampled (on a rising clock) value of the sampled integrated signal e.g. $V_{int}(t=t_0)$ is outside the threshold interval $\Delta V_{hyst}$ bounds, the comparator 454 consequently updates the bitstream bs value, which switches e.g. from digital high to digital low, the switching arrangement 50,51, controlled by the feedback network fb, cause, e.g., the signal $V_{PTAT}$ provided at output by the combination network 403 to be applied (with a plus sign) to the integrator 452, consequently, the value of $V_x$ is also updated e.g. to a new value having positive sign, in order to change the slope of the integrated signal $V_{int}$ of the integrator 452 and restore a value of the integrated signal $V_{int}$ within the threshold interval $\Delta V_{hyst}$ bounds, and the integrated signal $V_{int}$ value is consequently updated, and starts increasing.

Those of skill in the art will easily appreciate that operation as discussed previously in not strictly dictated by the signs and/or logic values exemplified and can be adapted to complementary signs and/or logic values without affecting operation.

Figure 7:
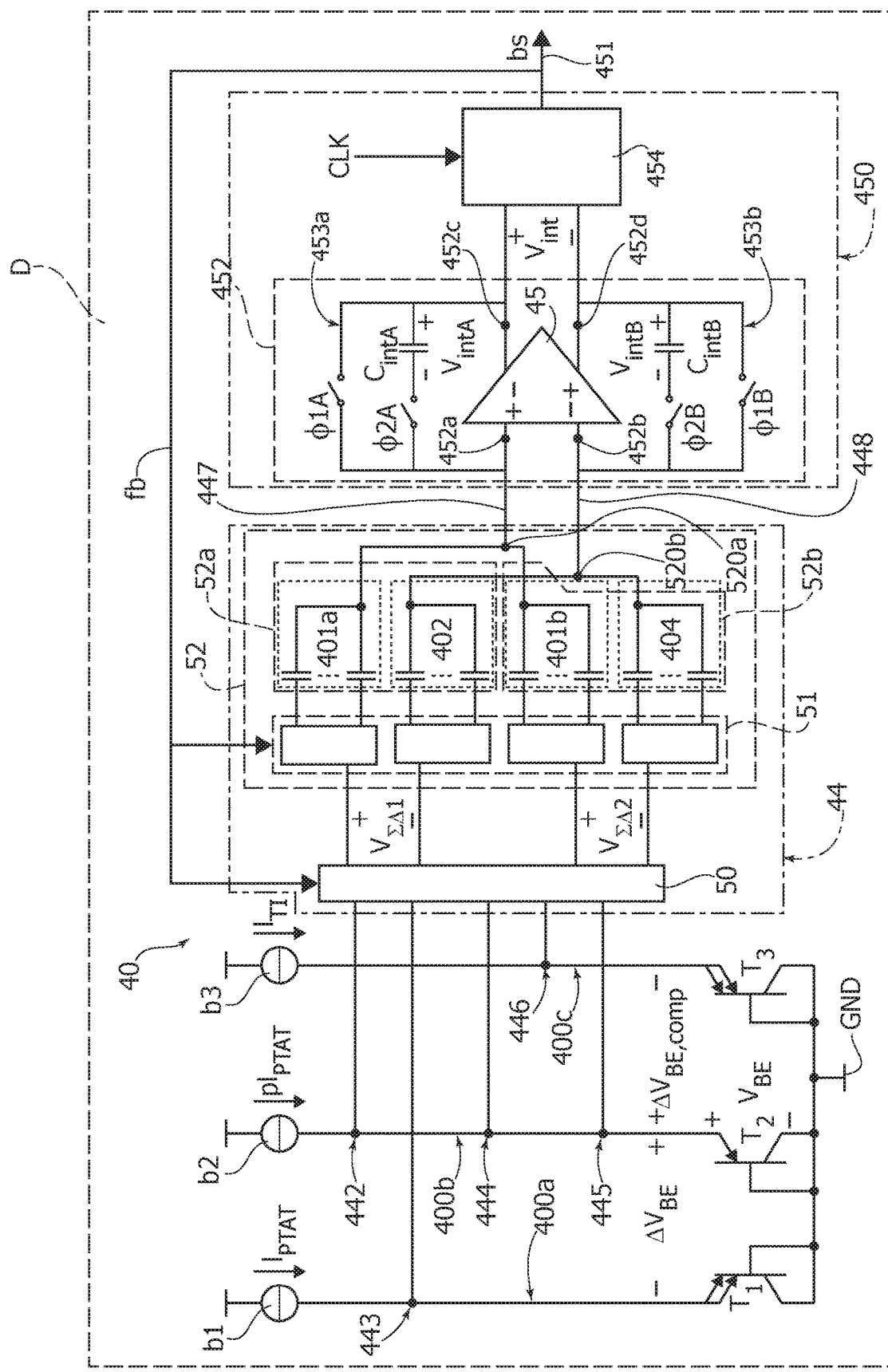
FIG. 7 is a circuit diagram exemplary of embodiments.

FIG. 7 illustrates a circuit diagram of an exemplary embodiment of a temperature sensor 40.

In one or more embodiments as exemplified in FIG. 7, the selection stage 44 may include:

a multiplexer 50, operated similarly to the first portion 50 of the switching arrangement of the foregoing, a network of switched capacitors 52.

In one or more embodiments as exemplified in FIG. 7, the network of switched capacitors 52 may include:

a control stage 51, operated similarly to the second portion 51 of the switching arrangement of the foregoing, a capacitor bank 52a, 52b (e.g. a network of capacitors) operated similarly to the first differential stage 401 (and its portions 401a, 401b), the second differential stage 402 and the (e.g. unitary gain) signal path 404 of the foregoing, and a pair of combination nodes 520a and 520b, being circuit portions exemplified as the combination network 403 in FIG. 4, operated similarly to the combination network 403 of the foregoing.

In one or more embodiments as exemplified in FIG. 7, the multiplexer 50 may be coupled to the input nodes 442,443, 444,445,446 of the selection stage 44, to the feedback network fb and to the network of switched capacitors 52.

For instance, the multiplexer 50 may be sensitive to the voltage drops across the first diode-connected transistor T1, the second diode-connected transistor T2 and the third diode-connected transistor T3, and to the bitstream bs provided by the feedback network fb.

In the exemplary diagram of FIG. 7, the multiplexer 50 may be configured to selectively provide (at least one of) signals $\Delta$VBE, $\Delta$VBE,comp, VBE to the control stage 51 as a function of the value of the bitstream bs provided by the feedback network fb.

For instance, the multiplexer 50 may be operated to provide at output signals $V\Sigma\Delta 1$, $V\Sigma\Delta 2$ being indicative of:

the difference ($\Delta$VBE) of the voltage drops across the first diode-connected transistor (T1) and the second diode-connected transistor (T2) e.g. $V\Sigma\Delta 1 = V\Sigma\Delta 2 = \Delta$VBE when the bitstream bs signal has a first binary value (e.g. "0"), the difference ($\Delta$VBE,comp) of the voltage drops across the second diode-connected transistor (T2) and the third diode-connected transistor (T3) and to the voltage drop (VBE) across the second diode-connected transistor (T2), respectively, e.g. $V\Sigma\Delta 1 = -\Delta$VBE,comp, $V\Sigma\Delta 2 = -$VBE when the bitstream bs signal has a second binary value (e.g. "1").

For instance, the multiplexer 50 may alternatively select, for each clock cycle, one of the difference $\Delta$VBE of the voltage drops across the first diode-connected transistor T1 and the second diode-connected transistor T2 and a (e.g. linear) combination (e.g. having negative unitary coefficients) of the difference $\Delta$VBE,comp of the voltage drops across the second diode-connected transistor T2 and the third diode-connected transistor (T3) and the voltage drop VBE across the second diode-connected transistor T2, as a function of the bitstream bs value.

In the exemplary diagram of FIG. 7, the network of switched capacitors 52 may be coupled to the multiplexer 50, to the output node 451 via the feedback network fb and to the sigma-delta ADC 450 (input) nodes 447 and 448.

In one or more embodiments, the network of switched capacitors 52 may be sensitive to the signals $V\Sigma\Delta 1$, $V\Sigma\Delta 2$ provided (at output) by the multiplexer 50 and to the bitstream bs provided by the feedback network fb.

In the exemplary diagram of FIG. 7, the capacitor bank 52a, 52b may be selectively couplable to the multiplexer 50 via the control stage 51. For instance, the control stage 51 may receive (at input) the value of the bitstream bs provided by the feedback network fb and selectively couple the multiplexer 50 with a variable quantity of capacitors included in the capacitor bank 52a-52b, the quantity being variable as a function of the value of the bitstream bs. For this purpose, the control stage 51 may include at least one digital-to-analog converter (DAC) e.g. 1-bit DAC implemented as a changeover switch.

In one or more embodiments as exemplified in FIG. 7, the first portion 52a of the capacitor bank may include a first (sub)set of capacitors 401a and a second (sub)set of capacitors 402, circuit portions exemplified as differential stage 401(a) and differential stage 402, respectively, in FIGS. 4 and 5.

For instance, the capacitor sub-sets 401a, 402 of the first portion 52a of the capacitor bank may be parallel and mirror symmetrical to each other, including a (integer) number n of unit capacitors (CS1, . . . , CSj, . . . , CSn). A unit capacitor, as described in the foregoing and in the following, has a unitary capacitance CU.

In one or more embodiments as exemplified in FIG. 7, the second portion 52b of the capacitor bank may include a first (sub)set of capacitors 401b and a second (sub)set of capacitors 404, circuit portions exemplified as differential stage 401(b) and signal path 404, respectively, in FIGS. 4 and 5.

For instance, the capacitor sub-sets 401b, 404 of the second portion 52b of the capacitor bank may be parallel and mirror symmetrical to each other, each including a (integer) number m of unit capacitors (CS1, . . . , CSm).

In one or more embodiments as exemplified in FIG. 7, a first set of capacitors 401a, 401b may be operated similarly to the first differential stage 401 of FIG. 4, as well as a second set of capacitors 402, 404 may be operated similarly to the second differential stage 402 and to the signal path 404 of FIG. 4.

In the exemplary diagram of FIG. 7, the capacitor bank 52a, 52b may be used to periodically sample the input signals $V\Sigma\Delta 1$, $V\Sigma\Delta 2$. For instance, "sampling" may consist of periodically charging ("charge loading") the capacitor bank 52a, 52b as a function of the signals $V\Sigma\Delta 1$, $V\Sigma\Delta 2$ during a first clock phase, as described in the following (in the example of FIG. 8).

After "charge loading", the capacitor bank 52a, 52b may be thereafter discharged (or "dumped") onto combination nodes 520a and/or 520b during a second clock phase, as described in the following (in the example of FIG. 8).

In the exemplary diagram of FIG. 7, the "resulting" value Vx may be a weighted sum of the signals provided by the multiplexer 50 e.g. VΣΔ1, VΣΔ2 having variable weights j(bs) and k(bs), respectively, e.g. Vx=j(bs)·VΣΔ1+k(bs)·VΣΔ2. For instance, the variable weights j(bs) and k(bs) may vary, within respective value intervals 1≤j(bs)≤n and 1≤k(bs)≤m, as a function of the value of the bitstream bs and may be indicative of the variable quantity of unit capacitors selected by the control stage 51.

In an exemplary embodiment according to FIG. 7, the control stage 51 may selectively couple (one terminal) of a variable quantity j(bs) of unit capacitors and a variable quantity k(bs) of unit capacitors CU of the capacitor bank 52a-52b to the multiplexer 50 as a function of the value of the bitstream bs provided by the feedback network fb.

For instance, when the bitstream bs has a first value, e.g, bs=0:
the variable quantity j(bs) may have a first value j(bs=0)=j0=α for each (sub)set of capacitors 401a, 402 of the first portion 52a of the capacitor bank 52a-52b, resulting in both (sub)sets of capacitors 401a, 402 having the same equivalent capacitance value Ceq10, e.g., Ceq10=j0*CU=α*CU, and
the variable quantity k(bs) may have a first value k(bs=0)=k0=α for each (sub)set of capacitors 401b, 404 of the second portion 52b of the capacitor bank 52a-52b, resulting in both (sub)sets of capacitors 401b, 404 having the same equivalent capacitance value Ceq20, e.g., Ceq20=k0*CU=α*CU.

Alternatively, for instance, when the bitstream bs has a second value, e.g, bs=1:
the variable quantity j(bs) may have a second value j(bs=1)=j1=β for each (sub)set of capacitors 401a, 402 of the first portion 52a of the capacitor bank 52a-52b, resulting in both (sub)sets of capacitors 401a, 402 having the same equivalent capacitance value Ceq11, e.g., Ceq11=j1*CU=β*CU, and
the variable quantity k(bs) may have a second value k(bs=1)=k$_1$=1=β for each (sub)set of capacitors 401b, 404 of the second portion 52b of the capacitor bank 52a-52b, resulting in both (sub)sets of capacitors 401b, 404 having the same equivalent capacitance value Ceq$_{21}$, e.g., Ceq$_{21}$=k$_1$*C$_U$=C$_U$.

In an exemplary embodiment according to FIG. 7, the input nodes 447 and 448 of the sigma-delta ADC 450 may be coupled to the combination nodes 520a, 520b and to an integrator 452, providing (at output) an integrated signal V$_{int}$.

In one or more embodiments, the integrator 452 may include:
a differential stage 45 having a non-inverting input node 452a, an inverting input node 452b, an inverting output node 452c and a non-inverting output node 452d, wherein the output nodes 452c,452d and the input nodes 452a,452b are at virtual ground,
a first feedback branch 453a coupled to the non-inverting input 452a and to the inverting output 452c,
a second feedback branch 453b coupled to the inverting input 452b and the non-inverting output 452d.

For instance, the feedback branches 453a and 453b may be mirror symmetrical and each of them may respectively include:
a by-pass line, e.g. a wire, couplable to the input node 452a, respectively 452b, via a first switch ϕ$_{1A}$, respectively ϕ$_{1B}$, controlled by a first phase signal ϕ$_1$, a feedback capacitor C$_{intA}$, respectively C$_{intB}$, couplable to the input node 452a, respectively 452b, via a second switch ϕ$_{2A}$, respectively ϕ$_{2B}$, controlled by a second phase signal ϕ2, where the second phase signal ϕ2 is in phase opposition with respect to the first phase signal ϕ1.

In an exemplary embodiment according to FIG. 7, the capacitors C$_{intA}$ and C$_{intB}$ may have the same value of capacitance, e.g., C$_{intA}$=C$_{intB}$=C$_{int}$.

In one or more embodiments, the capacitor bank 52a-52b and the feedback capacitors C$_{intA}$, C$_{intB}$ of the feedback branches 453a, 453b, respectively, may be used to "sample and integrate" (as described in the example of FIG. 8) using a plurality of non-overlapping clock signals or a single clock signal divided into non-overlapping phases e.g. a first phase ϕ1, and a second phase ϕ2.

In an exemplary embodiment as in FIG. 7, the feedback network fb may be coupled to the output node 451, the multiplexer 50 and the control stage 51.

In one or more embodiments, the feedback network fb may enforce the condition that the time-average p of the bitstream bs approximates the time-average of the "resulting" value V$_x$ e.g. the ratio between the "resulting" value V$_x$ and a number k of samples taken in a time interval T. Hence, the average of the "resulting" value may be, accordingly, set to zero.

Consequently, the average value of the output signal bs, namely, may be expressed as:

$$\mu = \frac{\alpha_1 \cdot \Delta V_{BE} + \alpha_2 \cdot \Delta V_{BE}}{V_{BE} + \beta \cdot \Delta V_{BE,comp} + (\alpha_1 + \alpha_2) \cdot \Delta V_{BE}} = \frac{V_{PTAT}}{V_{REF\_LIN}}$$

FIG. 8 illustrates an exemplary possible time diagram of the analog and digital signals which are processed (e.g. either received at input, provided at output or generated internally) by the multiplexer 50, the capacitor bank 52a-52b and the integrator 452 of FIG. 7.

In FIG. 8:
portion a) shows a possible behavior of the analog signals, wherein:
portion a1) shows a possible behavior of signal V$_{ΣΔ1}$,
portion a2) shows a possible behavior of signal V$_{ΣΔ2}$,
portion a3) shows a possible behavior of signal V$_{int}$,
portion b) shows a possible behavior of the digital signals, wherein:
portion b1) shows a possible behavior of the bitstream bs, and
portion b2a) shows a possible behavior of the first phase ϕ$_1$ of the clock signal CLK having a period T corresponding to the length of a ΣΔ cycle,
portion b2b) shows a possible behavior of the second phase ϕ$_2$ of the clock signal CLK, which may be in antiphase (namely 180° phase shift) to the first phase ϕ$_1$.

In the exemplary diagram of FIG. 8, it may be possible to divide each ΣΔ cycle into a sampling interval and an integration interval. For instance, in FIG. 8:
I0S-I0I, I1S-I1I are a first and second sampling intervals, respectively, during which the value of the first phase ϕ$_1$ may be digital high while the second phase ϕ$_2$ may be digital low, and
I0I-I1S, I1I-I2S are a first and a second integration interval, respectively, during which the value of the first phase ϕ1 may be digital low while the second phase ϕ2 may be digital high.

Providing a clock signal CLK with two phases φ1, φ2 as described in the foregoing is conventional in the art, thus making it unnecessary to provide a more detailed description herein.

The clock signal CLK may operate the switches $\phi_{1A}$, $\phi_{1B}$, $\phi_{2A}$, $\phi_{2B}$, as well as the switching arrangement 50, 51 of FIG. 7.

For instance, during the first sampling interval I0S-I0I the control stage 51 may couple the multiplexer 50 to the capacitor bank 52a-52b. Moreover, during the first sampling interval I0S-I0I the clock signal phase may operate switches φ1A, φ1B to couple the input node 452a with the bypass line of the feedback branch 453a and the input node 452b with the bypass line of the feedback branch 453b, respectively.

Consequently, at the beginning of the first sampling interval I0S-I0I, the signals $V_{\Sigma A1}$, $V_{\Sigma A2}$ may be applied to the capacitor bank 52a-52b.

In the exemplary diagram of FIG. 8, at the beginning of the first sampling interval I0S-I0I the value of the bitstream bs is a first value, e.g., bs="0".

Consequently, the multiplexer 50, controlled by the feedback network fb, provides at output the signals $V_{\Sigma A1}$, $V_{\Sigma A2}$ having the same value, e.g., $V_{\Sigma A1}=V_{\Sigma A2}=\Delta V_{BE}$.

During the first sampling interval I0S-I0I, thus:

the first portion 52a of the capacitor bank 52a-52b is loaded with a first electric charge $Q_{\Sigma A1}$, e.g., $Q_{\Sigma A1}=V_{\Sigma A1}*Ceq_{10}=\Delta V_{BE}*\alpha*C_U$, and the second portion 52b of the capacitor bank 52a-52b is loaded with a second electric charge $Q_{\Sigma A2}$, e.g., $Q_{\Sigma A2}=V_{\Sigma A2}*Ceq_{20}=\Delta V_{BE}*\alpha*C_U$.

In particular, for instance, the first electric charge $Q_{\Sigma A1}$ stored in the first portion 52a of the capacitor bank 52a-52b may be distributed across the (sub)sets of capacitors 401a, 402 into:

a first part $Q_{\Sigma A11}$, stored on the (sub)set of capacitors 401a, where the first part $Q_{\Sigma A11}$ is a fraction of the electric charge $Q_{\Sigma A1}$, e.g., $Q_{\Sigma A11}=Q_{\Sigma A1}/2$, and a second part $Q_{\Sigma A12}$ stored on the (sub)set of capacitors 402, having the opposite value of the charge stored on the (sub)set of capacitors 401a, e.g. $Q_{\Sigma A12}=-Q_{\Sigma A11}$.

In particular, for instance, the second electric charge $Q_{\Sigma A2}$ stored in the second portion 52b of the capacitor bank 52a-52b may be distributed across the (sub)sets of capacitors 401b, 404 into:

a first part $Q_{\Sigma A21}$, stored on the (sub)set of capacitors 401b, where the first part QΣA21 is a fraction of the electrical charge $Q_{\Sigma A2}$, e.g., $Q_{\Sigma A21}=Q_{\Sigma A2}/2$, and a second part $Q_{\Sigma A22}$ stored on the (sub)set of capacitors 404, having the opposite value of the charge stored on the (sub)set of capacitors 401b, e.g. $Q_{\Sigma A22}=-Q_{\Sigma A21}$.

During the first sampling interval I0S-I0I, for instance, the integrated signal $V_{int}$ provided by the integrator 452 is zero.

In the following first integration interval I0I-I1S, the clock signal may operate the switches $\phi_{2A}$, $\phi_{2B}$ to couple the input node 452a, 452b to the feedback capacitors $C_{intA}$, $C_{intB}$ of the feedback branches 453a, 453b, respectively.

Consequently, during the first integration interval I0I-I1S:

the feedback capacitor $C_{intA}$ is loaded with an electric charge $Q_{intA}$ having a value given by the sum of the electric charges $Q_{\Sigma A11}$ and $Q_{\Sigma A21}$ stored into (sub)sets of capacitors 401a and 401b, respectively, e.g. $Q_{intA}=Q_{\Sigma A11}+Q_{\Sigma A21}=Ceq_{10}*V_{\Sigma A1}+Ceq_{20}*V_{\Sigma A2}=\Delta V_{BE}*\alpha*C_U$.

the feedback capacitor $C_{intB}$ is loaded with a charge $Q_{intB}$ having a value given by the sum of the electric charges $Q_{\Sigma A12}$ and $Q_{\Sigma A22}$ stored into (sub)sets of capacitors 402 and 404, respectively, e.g., $Q_{intB}=Q_{\Sigma A21}+Q_{\Sigma A22}=-Q_{\Sigma A11}-Q_{\Sigma A21}=-\Delta V_{BE}*\alpha*C_U$.

Thus, during the integration interval I0I-I1S, the variation of the integrated signal $V_{int}$ with respect to the value assumed by $V_{int}$ during the previous integration interval has an amplitude $\Delta V_{int}$(bs=0) indicative of a difference of the voltage drops $V_{intA}$ and $V_{intB}$ across respective feedback capacitors $C_{intA}$ and $C_{intB}$, e.g., $V_{int}=\Delta V_{int}$(bs=0)=$V_{intA}-V_{intB}=2*\Delta V_{BE}*\alpha*C_U/C_{int}$.

The integrated signal $V_{int}$ as a function of phase signals φ1, φ2 may be, e.g., expressed by the relation:

$$V_{int} = \begin{cases} 0 & \text{if } \phi_1 = 1 \\ (V_{intA} - V_{intB}) + V_{int}|_{(previous\ \phi_2=1)} & \text{if } \phi_2 = 1 \end{cases}$$

In the exemplary diagram of FIG. 8, at the beginning of the second sampling interval I1S-I1I the value of the bitstream bs is a second value, e.g., bs="1".

Consequently, the multiplexer 50, controlled by the feedback network fb, provides at output the signals $V_{\Sigma A1}$, $V_{\Sigma A2}$ having different values, e.g., $V_{\Sigma A1}=-\Delta V_{BE,comp}$ and $V_{\Sigma A2}=-V_{BE}$.

During the second sampling interval I1S-I1I, thus:

the first portion 52a of the capacitor bank 52a-52b is loaded with a first electric charge $Q_{\Sigma A1}$, e.g., $Q_{\Sigma A1}=V_{\Sigma A1}*Ceq_{11}=-\Delta V_{BE,comp}*\beta*C_U$, and the second portion 52b of the capacitor bank 52a-52b is loaded with a second electric charge $Q_{\Sigma A2}$, e.g., $Q_{\Sigma A2}=V_{BE}*Ceq_{21}=V_{BE}*C_U$.

Again, for instance, the first electric charge Qxa stored in the first portion 52a of the capacitor bank 52a-52b may be distributed across the (sub)sets of capacitors 401a, 402 into:

a first part $Q_{\Sigma A1}$, stored on the (sub)set of capacitors 401a, where the first part $Q_{\Sigma A11}$ is a fraction of the electric charge $Q_{\Sigma A1}$, e.g., $Q_{\Sigma A11}=Q_{\Sigma A1}/2$, and a second part $Q_{\Sigma A12}$ stored on the (sub)set of capacitors 402, having the opposite value of the charge stored on the (sub)set of capacitors 401a, e.g. $Q_{\Sigma A12}=-Q_{\Sigma A11}$.

Again, for instance, the second electric charge $Q_{\Sigma A2}$ stored in the second portion 52b of the capacitor bank 52a-52b may be distributed across the (sub)sets of capacitors 401b, 404 into:

a first part $Q_{\Sigma A21}$, stored on the (sub)set of capacitors 401b, where the first part $Q_{\Sigma A21}$ is a fraction of the electrical charge $Q_{\Sigma A2}$, e.g., $Q_{\Sigma A21}=Q_{\Sigma A2}/2$, and a second part $Q_{\Sigma A22}$ stored on the (sub)set of capacitors 404, having the opposite value of the charge stored on the (sub)set of capacitors 401b, e.g. $Q_{\Sigma A22}=-Q_{\Sigma A21}$.

Again, during the second sampling interval I1S-I1I, for instance, the integrated signal $V_{int}$ provided by the integrator 452 is zero.

In the following second integration interval I1I-I2S, the switches φ2A, φ2B may be operated to couple the input node 452a, 452b to the feedback capacitors $C_{intA}$, $C_{intB}$ of the feedback branches 453a, 453b, respectively.

Consequently, during the second integration interval I1I-I2S:

the feedback capacitor $C_{intA}$ is loaded with an electric charge $Q_{intA}$ equal to the sum of the electric charges $Q_{\Sigma A11}$ and $Q_{\Sigma A21}$ stored into (sub)sets of capacitors 401a and 401b, respectively, e.g., $$Q_{intA}=Q_{\Sigma A11}+Q_{\Sigma A21}=Ceq_{11}*V_{\Sigma A1}+Ceq_{21}*V_{\Sigma A2}=(-\Delta V_{BE,comp}*\beta-V_{BE})*C_U/2.$$

the feedback capacitor $C_{intB}$ is loaded with a charge $Q_{intB}$ equal to the sum of the electric charges $Q_{\Sigma A12}$ and $Q_{\Sigma A22}$ stored into (sub)sets of capacitors 402 and 404, respectively, e.g., $$Q_{intB}=Q_{\Sigma A12}+Q_{\Sigma A22}=-Q_{\Sigma A11}-Q_{\Sigma A21}=(\Delta V_{BE,comp}*\beta*C_U+V_{BE})/2.$$

Thus, during the integration interval I1I-I2S, the variation of the integrated signal $V_{int}$, analogously, with respect to the value assumed by $V_{int}$ during the previous integration interval (i.e. interval I0I-I1S) has an amplitude $\Delta V_{int}(bs=1)$ indicative of a difference of the voltage drops $V_{intA}$ and $V_{intB}$ across respective feedback capacitors $C_{intA}$ and $C_{intB}$, e.g., $V_{int}=V_{intA}-V_{intB}=\Delta V_{int}(bs=1)=(-\Delta V_{BE,comp}*\beta-V_{BE})*C_U/C_{int}$.

In one or more embodiments, thus, any variation of the value of the integrated signal $V_{int}$ at the end of any integration phase, e.g. when $\phi 2$="1", is a relative variation (increase/decrease) with respect to the value of the integrated signal $V_{int}$ at the precedent/previous integration interval in the alternated sequence of sampling/integration intervals. Thus, the amplitude $\Delta V_{int}(bs=1)$ or $\Delta V_{int}(bs=0)$ are added (with sign) to the value of the integrated signal $V_{int}$ at the precedent/previous integration interval, e.g. the integration interval having $\phi 2$="1" preceding the integration interval considered.

FIG. 9 illustrates an exemplary possible time diagram of the signals which are processed (either e.g. received at input, provided at output, generated internally) by the sigma-delta ADC 450 of FIG. 7.

In FIG. 9:

portion a) shows a a possible behavior of signals, wherein:

portion a1) shows a possible behavior of the integrated signal $V_{int}$, portion a2) shows a possible behavior of the difference of the voltage drops $V_{intA}$ and $V_{intB}$ across respective feedback capacitors $C_{intA}$ and $C_{intB}$;

portion b) shows a possible behavior of the digital signals, wherein:

portion b1) shows a possible behavior of the bitstream bs, and portion b2) shows a possible behavior of the clock signal CLK, having frequency fs and period t=t0=1/fs.

portion b2a) shows a possible behavior of the first phase $\phi 1$ of the clock signal CLK having a period T corresponding to the length of a $\Sigma\Delta$ cycle, portion b2b) shows a possible behavior of the second phase $\phi 2$ of the clock signal CLK, which may be in antiphase (namely 180° phase shift) to the first phase $\phi 1$.

In one or more embodiments, the clock signal CLK may have a rising edge front anticipating the switching of the second phase signal from a first value, e.g., "1" to a second value, e.g., "0". Thus, the signals are sampled during sampling phases, e.g., when $\phi 2$=1.

Unless otherwise discussed in the following, in FIG. 9 parts or elements like parts or elements already discussed in the foregoing are indicated with like reference/numerals, so that a corresponding detailed description will not be repeated here for brevity.

In one or more embodiments according to FIG. 9, analogously to what described in relation to FIG. 8, sampling intervals IsS-IsI, where s is an integer indices indicating the $s^{th}$ sampling interval, are followed by integration intervals IiI-I(i+1)S, where i is an integer indices indicating the $i^{th}$ integration interval, in a continuous alternating series. For instance, a third integration interval may have i=3 within the time interval indicated as I3I-I4S in the figure. Accordingly, a fourth sampling interval, following the third integration interval, may have s=4 and correspond to the time interval indicated as I4S-I4I in FIG. 9.

In one or more embodiments according to FIG. 9, the integrated signal value at a certain integration interval, e.g., I3I-I4S, depends from the value of the integrated signal $V_{int}$ sampled during the previous integration interval, e.g., I2I-I3S.

In one or more embodiments according to FIG. 9, if during the certain integration interval, the bitstream bs has a first value, e.g., bs="0", then the difference of voltage drops $V_{int}$ and $V_{intB}$ across respective feedback capacitors $C_{intA}$ and $C_{intB}$ increments by a value, e.g., $\Delta V_{int}(bs=0)$.

In one or more embodiments according to FIG. 9, the integrated signal value at a certain integration interval, e.g., I1I-I2S, depends from the value of the integrated signal $V_{int}$ sampled during the previous integration interval, e.g., I0I-I1S.

In one or more embodiments according to FIG. 9, if during the certain integration interval, the bitstream bs has a second value, e.g., bs="1", then the difference of voltage drops $V_{intA}$ and $V_{intB}$ across respective feedback capacitors $C_{intA}$ and $C_{intB}$ decrements by a value, e.g., $\Delta V_{int}(bs=1)$.

To sum up:

the output of the temperature sensor 40 may be provided at output by the scaling circuit block 406 of FIG. 4 and may be expressed as:

$$D_{OUT}=A\cdot\mu-B$$

with respect to solutions in which the curvature is corrected in the bandgap reference, the proposed technique has the advantage that other non-idealities (such as offset and mismatch) do not affect the performance, moreover, the proposed solution facilitates obtaining reduced temperature error without using high order ratiometric corrections or digital/system-level curvature correction techniques, thus, the proposed solution may facilitate a robust and simple design of high-accuracy temperature sensors.

It will be otherwise understood that the various individual implementing options exemplified throughout the figures accompanying this description are not necessarily intended to be adopted in the same combinations exemplified in the figures. One or more embodiments may thus adopt these (otherwise non-mandatory) options individually and/or in different combinations with respect to the combination exemplified in the accompanying figures.

In one or more embodiments a circuit (for instance, 40) may include:

a first current source (e.g., b1) configured to produce a first current (e.g., $I_{PTAT}$) in a first current line (e.g., 400a) through a first diode-connected transistor (e.g., T1) having a voltage drop across the first diode-connected transistor, the first current proportional to absolute temperature via a first proportionality factor, a second current source (e.g., b2) configured to produce a second current (e.g., $pI_{PTAT}$) in a second current line (e.g., 400b) through a second diode-connected transistor (e.g., T2) having a voltage drop across the second diode-connected transistor, the second current proportional to absolute temperature via a second proportionality factor, the second proportionality factor different from the first proportionality factor, a third current source (e.g., b3) configured to produce a third, temperature-independent, current (e.g., $I_{TI}$) in a third current line (e.g., 400c) through a third diode-connected transistor having a voltage drop across the third diode-connected transistor, a processing network (e.g., 44, 450, 451, 406) coupled to the first diode-connected transistor, the second diode-connected transistor and the third diode-connected transistor, the processing network sensitive to:

a) a difference (e.g., $\Delta V_{BE}$) of the voltage drops across the first diode-connected transistor and the second diode-connected transistor, b) a difference (e.g., $\Delta V_{BE,comp}$) of the voltage drops across the second diode-connected transistor and the third diode-connected transistor, c) the voltage drop (e.g., VBE) across the second diode-connected transistor, wherein the processing network includes a sigma-delta analog-to-digital converter (e.g., 450) active with opposed signs on the one resp. the other of:

i) the difference of the voltage drops across the first diode-connected transistor and the second diode-connected transistor, ii) a combination of the difference of the voltage drops across the second diode-connected transistor and the third diode-connected transistor and the voltage drop across the second diode-connected transistor, wherein an output bitstream (e.g., bs) at an output node (e.g., 451) from the sigma-delta analog-to-digital converter has an average value (e.g., µ) providing a temperature sensing signal with a linear dependency on temperature.

One or more embodiments may include a scaling circuit block (e.g., 406) coupled to the output node from the sigma-delta analog-to-digital converter and sensitive to the output bitstream from the sigma-delta analog-to-digital converter, the scaling circuit block configured to provide a scale conversion of the temperature sensing signal.

In one or more embodiments, the processing network may include:

a first differential stage (e.g., 401; 401a, 401b) having inputs coupled to the first and the second diode-connected transistors, wherein the first differential stage is sensitive to a difference of the voltage drops across the first diode-connected transistor and the second diode-connected transistor, with the output signal from the first differential stage providing a first signal (e.g., $V_{PTAT}$) proportional to absolute temperature, a second differential stage (e.g., 402) having inputs coupled to the second and third diode-connected transistors, wherein the second differential stage is sensitive to a difference (e.g., $\Delta VBE,comp$) of the voltage drops across the second diode-connected transistor and the third diode-connected transistor, the output signal from the second differential stage providing a second signal (e.g., Vβ) proportional to absolute temperature.

In one or more embodiments, the first differential stage may have a first gain, α, and the second differential stage may have a second gain, β, with the average value (e.g., µ) of the output bitstream (e.g., bs) from the sigma-delta analog-to-digital converter (e.g., 450) given by the relationship, $$\mu = \frac{\alpha \cdot \Delta V_{BE}}{V_{BE} + \beta \cdot \Delta V_{BE,comp} + \alpha \cdot \Delta V_{BE}}$$

where:

$\Delta VBE$ is the difference of the voltage drops across the first diode-connected transistor and the second diode-connected transistor, $\Delta VBE,comp$ is the difference of the voltage drops across the second diode-connected transistor and the third diode-connected transistor VBE is the voltage drop across the second diode-connected transistor, wherein the first gain, α, and the second gain, β, are set to values wherein the denominator in the relationship is constant.

One or more embodiments may include a combination network (e.g., 403; 520a, 520b) coupled to:

the first differential stage, the second differential stage, and a signal propagation path (e.g., 404) from the second diode-connected transistor, wherein the combination network is active on the output signal from the first differential stage, the output signal from the second differential stage the "true" input differential voltage, the signal over the signal propagation path.

One or more embodiments may include a selection stage (e.g., 44) configured to render the sigma-delta analog-to-digital converter alternatively active on:

i) the difference of the voltage drops across the first diode-connected transistor and the second diode-connected transistor, ii) the combination of the difference of the voltage drops across the second diode-connected transistor and the third diode-connected transistor and the voltage drop across the second diode-connected transistor.

One or more embodiments may include a feedback network (e.g., fb) from the output node of the sigma-delta analog-to-digital converter to the selection stage wherein the selection stage is configured to operate as a function of the bitstream signal at the output node of the sigma-delta analog-to-digital converter.

In one or more embodiments, the selection stage may include:

a switching arrangement (e.g., 50, 51) coupled to the first diode-connected transistor, the second diode-connected transistor, the third diode-connected transistor, the switching arrangement configured to sense the voltage drops across the first diode-connected transistor, the second diode-connected transistor and the third diode-connected transistor, the switching arrangement coupled to the feedback network from the output node of the sigma-delta converter, and a capacitor bank (e.g., 52a, 52b) between the switching arrangement and the sigma-delta analog-to-digital converter, the capacitor bank including a first set of capacitors and a second set of capacitors configured to store thereon charge as a function of the voltage drops across the first diode-connected transistor, the second diode-connected transistor and the third diode-connected transistor sensed by the switching arrangement, wherein the first set of capacitors (e.g., 401a, 401b) and the second set of capacitors (e.g., 402, 404) are configured to transfer charge stored thereon to a first input node (e.g., 447) and a second input node (e.g., 448), respectively, of the sigma-delta analog-to-digital converter.

In one or more embodiments, the switching arrangement may be configured to be switched by the feedback network from the output node of the sigma-delta analog-to-digital converter between:

a first operation mode with the bitstream signal at the output node of the sigma-delta analog-to-digital converter at a first value, wherein signals indicative of the difference of the voltage drops across the first diode-connected transistor and the second diode-connected transistor are applied to a first number of capacitors in the capacitor bank, the first number being a function of the first value of the bitstream signal at the output node of the sigma-delta analog-to-digital converter, and a second operation mode with the bitstream signal at the output node of the sigma-delta analog-to-digital converter at a second value, wherein signals indicative of the combination of the difference of the voltage drops across the second diode-connected transistor and the third diode-connected transistor and the voltage drop across the second diode-connected transistor are applied to a second number of capacitors in the capacitor bank, the second number being a function of the second value of the bitstream signal at the output node of the sigma-delta analog-to-digital converter.

In one or more embodiments, the sigma-delta analog-to-digital converter may be operable in alternate first sampling phases (e.g., Φ1) and second integration phases (e.g., Φ2), wherein charge is stored on capacitors in the capacitor bank and transferred to the first and second input nodes of the sigma-delta analog-to-digital converter for integration therein.

In one or more embodiments:
the first proportionality factor may be unitary, and/or
the second proportionality factor may be a multiple of the first proportionality factor.

In one or more embodiments, the first, the second and the third diode-connected transistors may include bipolar transistors.

In one or more embodiments a system (e.g., D) may include at least one digital temperature sensor, the sensor including a circuit according to one or more embodiments.

In one or more embodiments a method may include:
producing a first current in a first current line through a first diode-connected transistor having a voltage drop across the first diode-connected transistor, the first current proportional to absolute temperature via a first proportionality factor, producing a second current in a second current line through a second diode-connected transistor having a voltage drop across the second diode-connected transistor, the second current proportional to absolute temperature via a second proportionality factor, the second proportionality factor different from the first proportionality factor, producing a third, temperature-independent, current in a third current line through a third diode-connected transistor having a voltage drop across the third diode-connected transistor, and applying sigma-delta analog-to-digital conversion processing with opposed signs on the one resp. the other of:

i) a difference of the voltage drops across the first diode-connected transistor and the second diode-connected transistor, ii) a combination of the difference of the voltage drops across the second diode-connected transistor and the third diode-connected transistor and the voltage drop across the second diode-connected transistor, wherein an output bitstream from the sigma-delta analog-to-digital conversion processing has an average value providing a temperature sensing signal with a linear dependency on temperature.

Without prejudice to the underlying principles, the details and embodiments may vary, even significantly, with respect to what has been described by way of example only, without departing from the extent of protection.

What is claimed is:
1. A circuit, comprising:
a first current source configured to produce a first current in a first current line through a first diode-connected transistor having a voltage drop across the first diode-connected transistor, the first current being proportional to an absolute temperature via a first proportionality factor;

a second current source configured to produce a second current in a second current line through a second diode-connected transistor having a voltage drop across the second diode-connected transistor, the second current being proportional to the absolute temperature via a second proportionality factor, the second proportionality factor being different from the first proportionality factor;

a third current source configured to produce a third current in a third current line through a third diode-connected transistor having a voltage drop across the third diode-connected transistor; and a processing network comprising a sigma-delta analog-to-digital converter, the processing network being coupled to the first diode-connected transistor, the second diode-connected transistor, and the third diode-connected transistor, wherein an output bitstream at an output node from the sigma-delta analog-to-digital converter has an average value providing a temperature sensing signal with a linear dependency on temperature, the processing network being sensitive to:

a difference of the voltage drops across the first diode-connected transistor and the second diode-connected transistor, a difference of the voltage drops across the second diode-connected transistor and the third diode-connected transistor, and the voltage drop across the second diode-connected transistor.

2. The circuit of claim 1, wherein the sigma-delta analog-to-digital converter is active with opposed signs on:
the difference of the voltage drops across the first diode-connected transistor and the second diode-connected transistor; and a combination of the difference of the voltage drops across the second diode-connected transistor and the third diode-connected transistor and the voltage drop across the second diode-connected transistor.

3. The circuit of claim 1, wherein the third current is independent of temperature.

4. The circuit of claim 1, further comprising a scaling circuit block coupled to the output node from the sigma-delta analog-to-digital converter and sensitive to the output bitstream from the sigma-delta analog-to-digital converter.

5. The circuit of claim 4, wherein the scaling circuit block is configured to provide a scale conversion of the temperature sensing signal.

6. The circuit of claim 1, wherein the processing network further comprises:
a first differential stage having inputs coupled to the first and the second diode-connected transistors, wherein the first differential stage is sensitive to a difference of the voltage drops across the first diode-connected transistor and the second diode-connected transistor, with an output signal from the first differential stage providing a first signal proportional to absolute temperature; and a second differential stage having inputs coupled to the second and third diode-connected transistors, wherein the second differential stage is sensitive to a difference of the voltage drops across the second diode-connected transistor and the third diode-connected transistor, an output signal from the second differential stage providing a second signal proportional to absolute temperature.

7. The circuit of claim 6, wherein the first differential stage has a first gain, denoted by symbol $\alpha$, and the second differential stage has a second gain, denoted by symbol $\beta$, with an average value, denoted by symbol $\mu$, of the output bitstream from the sigma-delta analog-to-digital converter given by a relationship, $$\mu = \frac{\alpha \cdot \Delta V_{BE}}{V_{BE} + \beta \cdot \Delta V_{BE,comp} + \alpha \cdot \Delta V_{BE}}$$

where:
$\Delta V_{BE}$ is the difference of the voltage drops across the first diode-connected transistor and the second diode-connected transistor;
$\Delta V_{BE,comp}$ is the difference of the voltage drops across the second diode-connected transistor and the third diode-connected transistor; and
$V_{BE}$ is the voltage drop across the second diode-connected transistor, wherein the first gain and the second gain are set to values in which a denominator in the relationship is constant.

8. The circuit claim 7, further comprising a combination network coupled to the first differential stage, the second differential stage, and a signal propagation path from the second diode-connected transistor, wherein the combination network is active on the output signal from the first differential stage, the output signal from the second differential stage, an input differential voltage, and the signal over the signal propagation path.

9. The circuit of claim 7, further comprising a selection stage configured to render the sigma-delta analog-to-digital converter alternatively active on:
the difference of the voltage drops across the first diode-connected transistor and the second diode-connected transistor; and
the combination of the difference of the voltage drops across the second diode-connected transistor and the third diode-connected transistor and the voltage drop across the second diode-connected transistor.

10. The circuit of claim 9, further comprising a feedback network from the output node of the sigma-delta analog-to-digital converter to the selection stage, wherein the selection stage is configured to operate as a function of a bitstream signal at the output node of the sigma-delta analog-to-digital converter.

11. The circuit of claim 10, wherein the selection stage comprises:
a switching arrangement coupled to the first diode-connected transistor, the second diode-connected transistor, the third diode-connected transistor, the switching arrangement configured to sense the voltage drops across the first diode-connected transistor, the second diode-connected transistor, and the third diode-connected transistor, the switching arrangement coupled to the feedback network from the output node of the sigma-delta analog-to-digital converter; and
a capacitor bank between the switching arrangement and the sigma-delta analog-to-digital converter, the capacitor bank comprising a first set of capacitors and a second set of capacitors configured to store charge as a function of the voltage drops across the first diode-connected transistor, the second diode-connected transistor, and the third diode-connected transistor sensed by the switching arrangement, wherein the first set of capacitors and the second set of capacitors are configured to transfer charge stored thereon to a first input node and a second input node, respectively, of the sigma-delta analog-to-digital converter.

12. The circuit of claim 11, wherein the switching arrangement is configured to be switched by the feedback network from the output node of the sigma-delta analog-to-digital converter between:
a first operation mode with the bitstream signal at the output node of the sigma-delta analog-to-digital converter at a first value, wherein signals indicative of the difference of the voltage drops across the first diode-connected transistor and the second diode-connected transistor are applied to a first number of capacitors in the capacitor bank, the first number being a function of the first value of the bitstream signal at the output node of the sigma-delta analog-to-digital converter; and
a second operation mode with the bitstream signal at the output node of the sigma-delta analog-to-digital converter at a second value, wherein signals indicative of the combination of the difference of the voltage drops across the second diode-connected transistor and the third diode-connected transistor and the voltage drop across the second diode-connected transistor are applied to a second number of capacitors in the capacitor bank, the second number being a function of the second value of the bitstream signal at the output node of the sigma-delta analog-to-digital converter.

13. The circuit claim 11, wherein the sigma-delta analog-to-digital converter is operable in alternate first sampling phases and second integration phases, wherein charge is stored on capacitors in the capacitor bank and transferred to the first and second input nodes of the sigma-delta analog-to-digital converter for integration therein.

14. The circuit of claim 1, wherein the first proportionality factor is unitary.

15. The circuit of claim 14, wherein the second proportionality factor is a multiple of the first proportionality factor.

16. The circuit of claim 1, wherein at least one of the first, the second, or the third diode-connected transistors comprises a bipolar transistor.

17. A system comprising at least one digital temperature sensor, the digital temperature sensor comprising a circuit, the circuit comprising:
a first current source configured to produce a first current in a first current line through a first diode-connected transistor having a voltage drop across the first diode-connected transistor, the first current being proportional to an absolute temperature via a first proportionality factor;
a second current source configured to produce a second current in a second current line through a second diode-connected transistor having a voltage drop across the second diode-connected transistor, the second current being proportional to the absolute temperature via a second proportionality factor, the second proportionality factor being different from the first proportionality factor;
a third current source configured to produce a third current in a third current line through a third diode-connected transistor having a voltage drop across the third diode-connected transistor; and a processing network comprising a sigma-delta analog-to-digital converter, the processing network being coupled to the first diode-connected transistor, the second diode-connected transistor, and the third diode-connected transistor, wherein an output bitstream at an output node from the sigma-delta analog-to-digital converter has an average value providing a temperature sensing signal with a linear dependency on temperature, wherein the sigma-delta analog-to-digital converter is active with opposed signs on:
the difference of the voltage drops across the first diode-connected transistor and the second diode-connected transistor, and
a combination of the difference of the voltage drops across the second diode-connected transistor and the third diode-connected transistor and the voltage drop across the second diode-connected transistor.

18. The system of claim 17, wherein the processing network is sensitive to:
a difference of the voltage drops across the first diode-connected transistor and the second diode-connected transistor;
a difference of the voltage drops across the second diode-connected transistor and the third diode-connected transistor; and
the voltage drop across the second diode-connected transistor.

19. The system of claim 17, wherein the circuit further comprises a selection stage configured to render the sigma-delta analog-to-digital converter alternatively active on:
the difference of the voltage drops across the first diode-connected transistor and the second diode-connected transistor; and
the combination of the difference of the voltage drops across the second diode-connected transistor and the third diode-connected transistor and the voltage drop across the second diode-connected transistor.

20. A method, comprising:
producing a first current in a first current line through a first diode-connected transistor having a voltage drop across the first diode-connected transistor, the first current proportional to absolute temperature via a first proportionality factor;
producing a second current in a second current line through a second diode-connected transistor having a voltage drop across the second diode-connected transistor, the second current proportional to absolute temperature via a second proportionality factor, the second proportionality factor different from the first proportionality factor;
producing a third, temperature-independent, current in a third current line through a third diode-connected transistor having a voltage drop across the third diode-connected transistor; and
applying sigma-delta analog-to-digital conversion processing with opposed signs on the following:
a difference of the voltage drops across the first diode-connected transistor and the second diode-connected transistor; and
a combination of the difference of the voltage drops across the second diode-connected transistor and the third diode-connected transistor and the voltage drop across the second diode-connected transistor, wherein an output bitstream from the sigma-delta analog-to-digital conversion processing has an average value providing a temperature sensing signal with a linear dependency on temperature.

* * * * *